United States Patent
Miyanaka et al.

(10) Patent No.: US 11,843,927 B2
(45) Date of Patent: Dec. 12, 2023

(54) ACOUSTIC CONTROL SYSTEM

(71) Applicant: Panasonic Intellectual Property Management Co., Ltd., Osaka (JP)

(72) Inventors: Ryota Miyanaka, Osaka (JP); Daiki Cho, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/682,103

(22) Filed: Feb. 28, 2022

(65) Prior Publication Data

US 2023/0283952 A1 Sep. 7, 2023

(51) Int. Cl.
| | |
|---|---|
| H04R 3/04 | (2006.01) |
| H04R 29/00 | (2006.01) |
| H04R 3/00 | (2006.01) |
| H04R 1/40 | (2006.01) |
| H04R 3/12 | (2006.01) |
| H04R 1/08 | (2006.01) |

(52) U.S. Cl.
CPC ............. *H04R 3/04* (2013.01); *H04R 1/08* (2013.01); *H04R 1/403* (2013.01); *H04R 1/406* (2013.01); *H04R 3/005* (2013.01); *H04R 3/12* (2013.01); *H04R 29/002* (2013.01); *H04R 29/008* (2013.01)

(58) Field of Classification Search
None
See application file for complete search history.

(56) References Cited

U.S. PATENT DOCUMENTS

| | | | |
|---|---|---|---|
| 2010/0014683 | A1 | 1/2010 | Maeda et al. |
| 2017/0061952 | A1 | 3/2017 | Sakaguchi |
| 2017/0323629 | A1 | 11/2017 | Sakaguchi |
| 2019/0149916 | A1* | 5/2019 | Takayama ............... H04R 5/04 381/26 |
| 2020/0098347 | A1* | 3/2020 | Kubota ............... G10K 11/178 |

FOREIGN PATENT DOCUMENTS

| | | |
|---|---|---|
| EP | 1 995 720 | 11/2008 |
| EP | 2 498 249 | 9/2012 |
| EP | 3 293 108 | 3/2018 |
| EP | 3 627 492 | 3/2020 |
| JP | 5-61475 | 3/1993 |
| JP | 7-2087 | 1/1995 |
| JP | 2009-143382 | 7/2009 |
| JP | 2017-50847 | 3/2017 |
| WO | 2021/010006 | 1/2021 |

OTHER PUBLICATIONS

Extended European Search Report dated Jun. 2, 2023 in corresponding European Patent Application No. 22188020.6.

* cited by examiner

*Primary Examiner* — Kenny H Truong
(74) *Attorney, Agent, or Firm* — WENDEROTH, LIND & PONACK, L.L.P.

(57) ABSTRACT

An acoustic control system includes a peripheral wall provided so as to surround a seat, and an upper portion of the peripheral wall being opened, a speaker provided inside the peripheral wall and capable of outputting a reproduced sound from a sound source, a microphone provided toward an outside of the peripheral wall and configured to collect an environmental sound around the peripheral wall, and a processor. The processor configured to suppress a level of the reproduced sound in a predetermined frequency band from the speaker based on the environmental sound collected by the microphone.

7 Claims, 19 Drawing Sheets

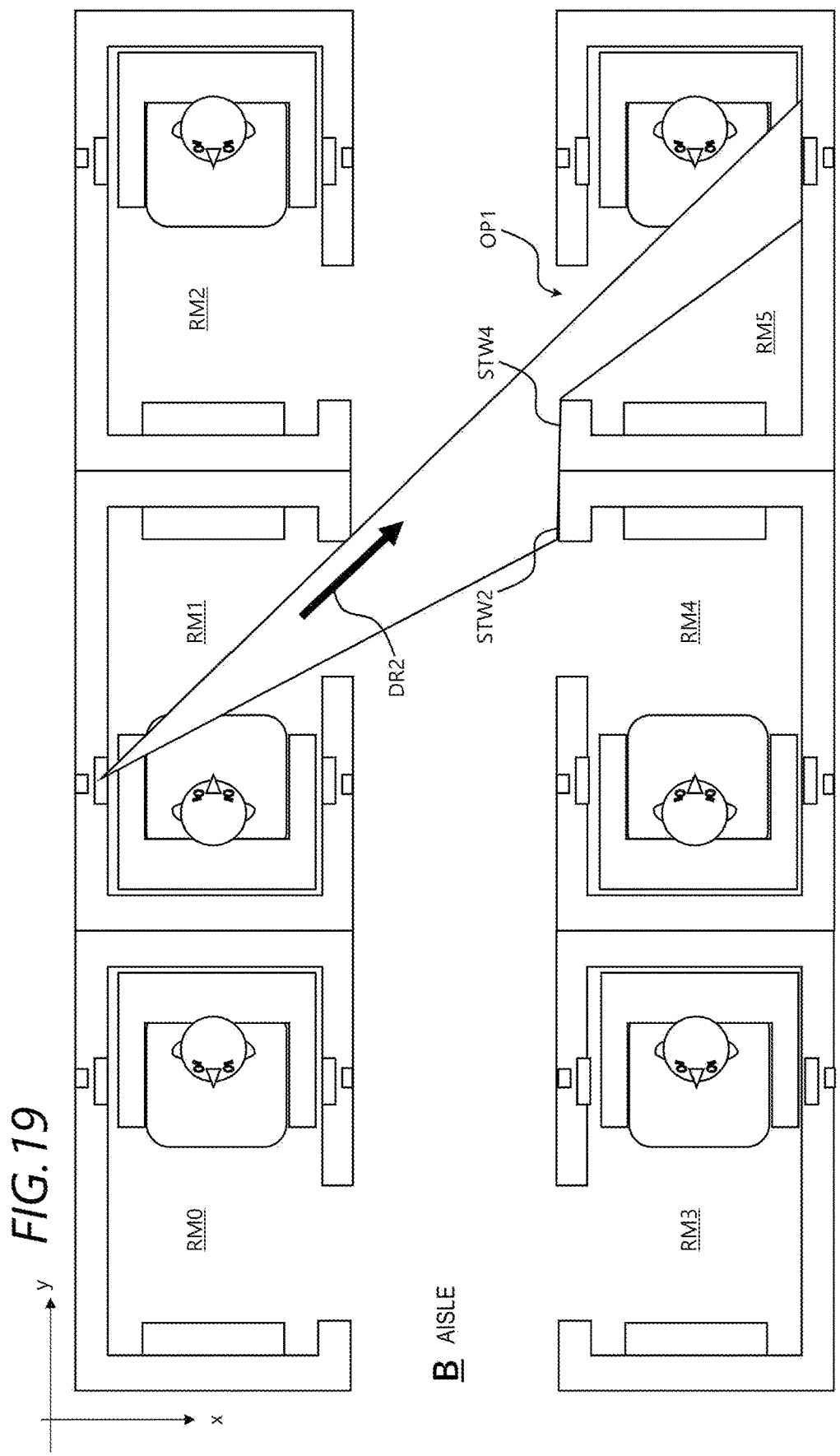

ACOUSTIC CONTROL SYSTEM

TECHNICAL FIELD

The present disclosure relates to an acoustic control system.

BACKGROUND ART

In a moving body such as an aircraft or a railway vehicle having high noise, a music service may be provided to a passenger sitting on a seat. Since the aircraft or the railway vehicle moves at high speeds, various noises are generated at various portions. The noise is generated by, for example, vibration generated from an engine or a motor of a power source, or a collision sound between the moving body moving at a high speed and air.

Patent Literature 1 discloses an audio area reproduction method using a speaker array. In this area reproduction method, a noise level is measured based on an environmental sound, and at each frequency, a reproduced sound is adjusted, so that a sound pressure of the reproduced sound reaching a reproduction line of a control line exceeds the noise level and the sound pressure of the reproduced sound reaching a non-reproduction line of the control line does not exceed the noise level.

Patent Literature 1: JP-A-2017-50847

SUMMARY OF INVENTION

The present disclosure provides an acoustic control system capable of effectively generating a reproduced sound field of content viewed by a user in a target room such as a semi-private room in which noise occurs.

The present disclosure provides an acoustic control system, which includes: a peripheral wall provided so as to surround a seat, and an upper portion of the peripheral wall being opened; a speaker provided inside the peripheral wall so as to face the seat and capable of outputting a reproduced sound from a sound source; a microphone provided toward the outside of the peripheral wall and collecting an environmental sound around the peripheral wall; and a processor. The processor suppresses a level of the reproduced sound in a predetermined frequency band from the speaker based on the environmental sound collected by the microphone.

According to the present disclosure, it is possible to effectively generate a reproduced sound field of content viewed by a user in a target room such as a semi-private room in which noise occurs.

BRIEF DESCRIPTION OF DRAWINGS

FIG. 19 illustrates a second layout example in which a plurality of seats of the cabin B in which no door is provided are arranged.

DESCRIPTION OF EMBODIMENTS

Hereinafter, embodiments specifically disclosing an acoustic control system and an audio device according to the present disclosure will be described in detail with reference to the drawings as appropriate. However, an unnecessarily detailed description may be omitted. For example, a detailed description of a well-known matter or a repeated description of substantially the same configuration may be omitted. This is to avoid unnecessary redundancy in the following description and to facilitate understanding of those skilled in the art. The accompanying drawings and the following description are provided for a thorough understanding of the present disclosure by those skilled in the art, and are not intended to limit a subject matter recited in the claims.

First Embodiment

A first embodiment provides an acoustic control system that forms a sound field room in which a user (for example, a passenger) can enjoy audio of content such as a movie without wearing headphones or earphones in an environment, such as an aircraft, in which predetermined noise generates. Hereinafter, an example in which the acoustic control system according to the first embodiment is mounted on an aircraft 100 will be described.

Figure 1:
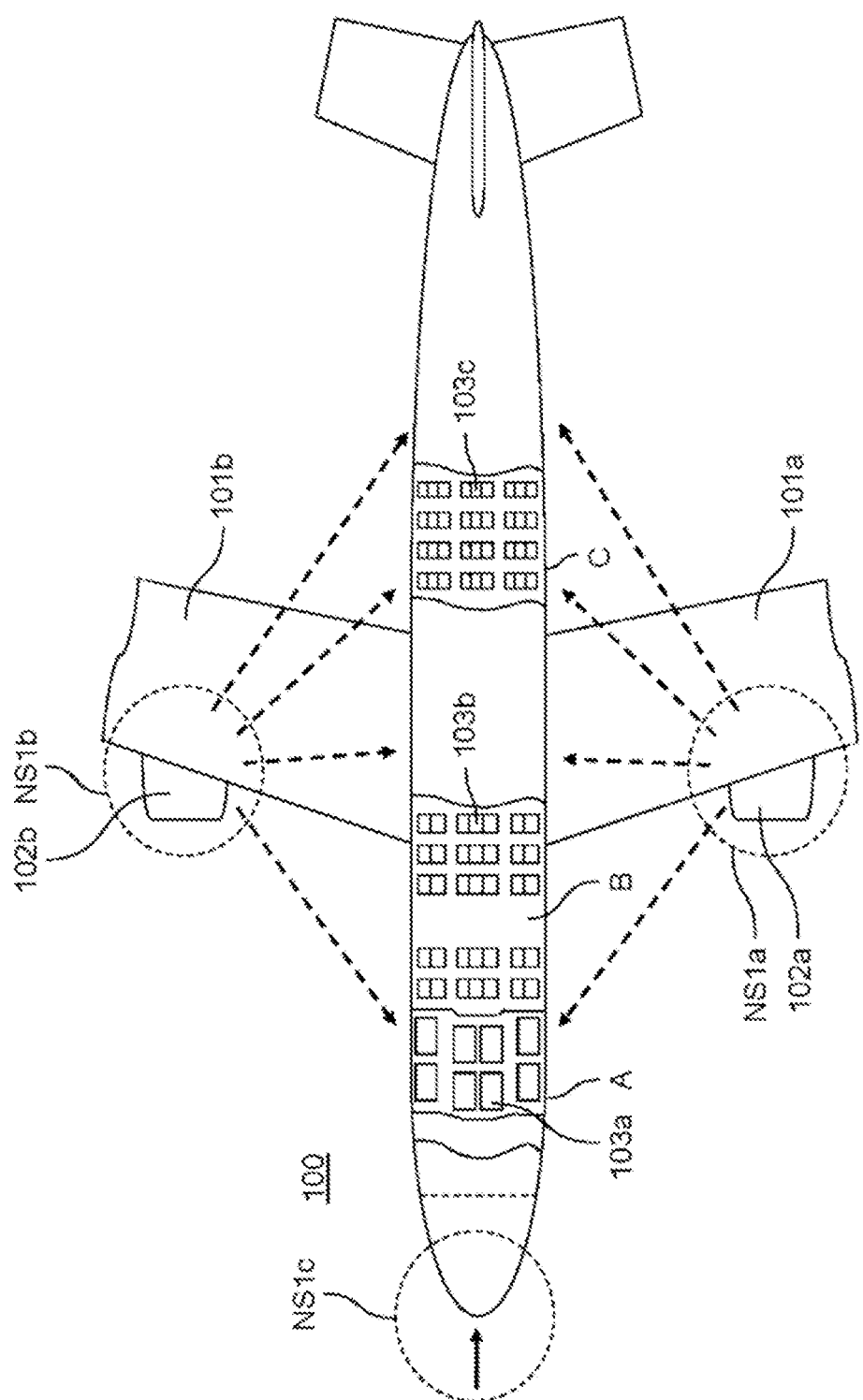
FIG. 1 schematically illustrates a generation source of aircraft noise generated in an aircraft in which an acoustic control system is installed.
Figure 2:
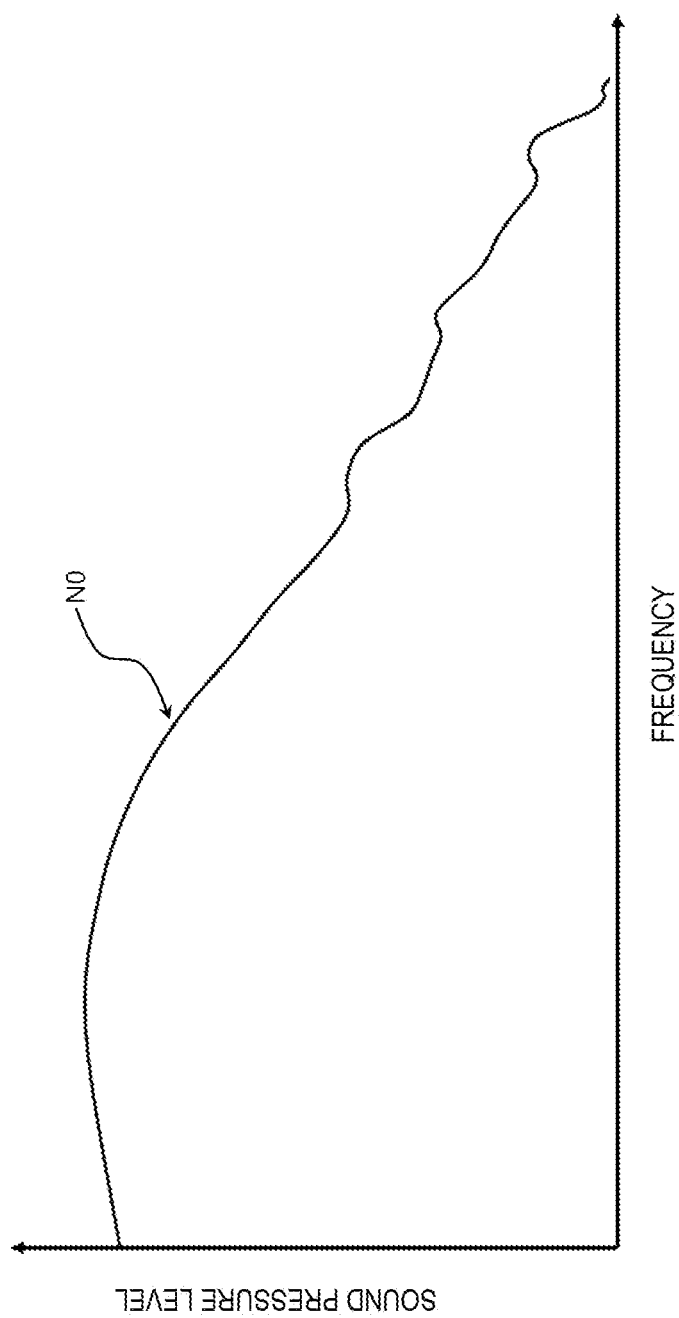
FIG. 2 illustrates a characteristic example of the aircraft noise.

First, a sound environment of the aircraft 100 will be described with reference to FIGS. 1 and 2. FIG. 1 is a diagram schematically illustrating a generation source of aircraft noise generated in the aircraft 100 in which an acoustic control system 200 is installed. FIG. 2 is a diagram illustrating a characteristic example of the aircraft noise.

As illustrated in FIG. 1, the aircraft 100 includes an airframe body, left and right wings 101a, 101b provided to protrude from the airframe body, and engines 102a, 102b respectively mounted on the wings 101a, 101b. Here, considering the sound environment of a room in the aircraft 100, sounds emitted from the engines 102a, 102b are not only rotation sounds of propellers (not shown) respectively built in the engines 102a, 102b, but also sounds associated with reverberations of air streams during a flight, or the like, and thus a large noise source is generated.

The engines 102a, 102b act as external noise sources NS1a, NS1b for seat rows 103a, 103b, 103c which are respectively arranged in, for example, a cabin A (e.g., first class), a cabin B (e.g., business class), and a cabin C (e.g., economy class) in the aircraft. Further, a collision sound (wind noise) between an air stream and each of a nose cone portion, a side surface portion, and the wings 101a, 101b of an airframe of the aircraft 100 that is caused by the airframe moving at a high speed in an air layer of the sky acts as a noise source NS1c.

A horizontal axis of FIG. 2 represents a frequency, and a vertical axis of FIG. 2 represents a sound pressure level. A characteristic N0 of aircraft noise illustrated in FIG. 2 indicates a frequency characteristic with respect to a signal collected by a microphone (see below) disposed in the aircraft 100. In the characteristic N0, the sound pressure level in a low-frequency range portion is high, and the sound pressure level gradually decreases from a mid-frequency range portion to a high-frequency range portion.

In a frequency band in which a sound pressure level (not shown in FIG. 2) of a content audio signal of a movie or the like exceeds the sound pressure level of the signal of the aircraft noise, so-called sound leakage occurs. In the signal of the aircraft noise, the noise in the low-frequency range is large. Therefore, it is considered that the sound pressure level of the signal of the aircraft noise does not fall below the sound pressure level of the content audio signal in the frequency band of the low-frequency range.

Meanwhile, the sound pressure level of the signal of the aircraft noise falls below the sound pressure level of the content audio signal in the frequency band of the high-frequency range. Therefore, in a noise environment of the aircraft 100 or the like, when the user (passenger) listens to content audio without wearing headphones or earphones, the sound leakage occurs in the high-frequency range of the content audio. In particular, when rooms to be subjected to audio control are arranged adjacent to each other (see FIG. 18 or 19), a sound leaks to the adjacent aisle or seat. Such sound leakage is a nuisance for other users (passengers) and causes a problem in operation of the aircraft 100.

Figure 3:
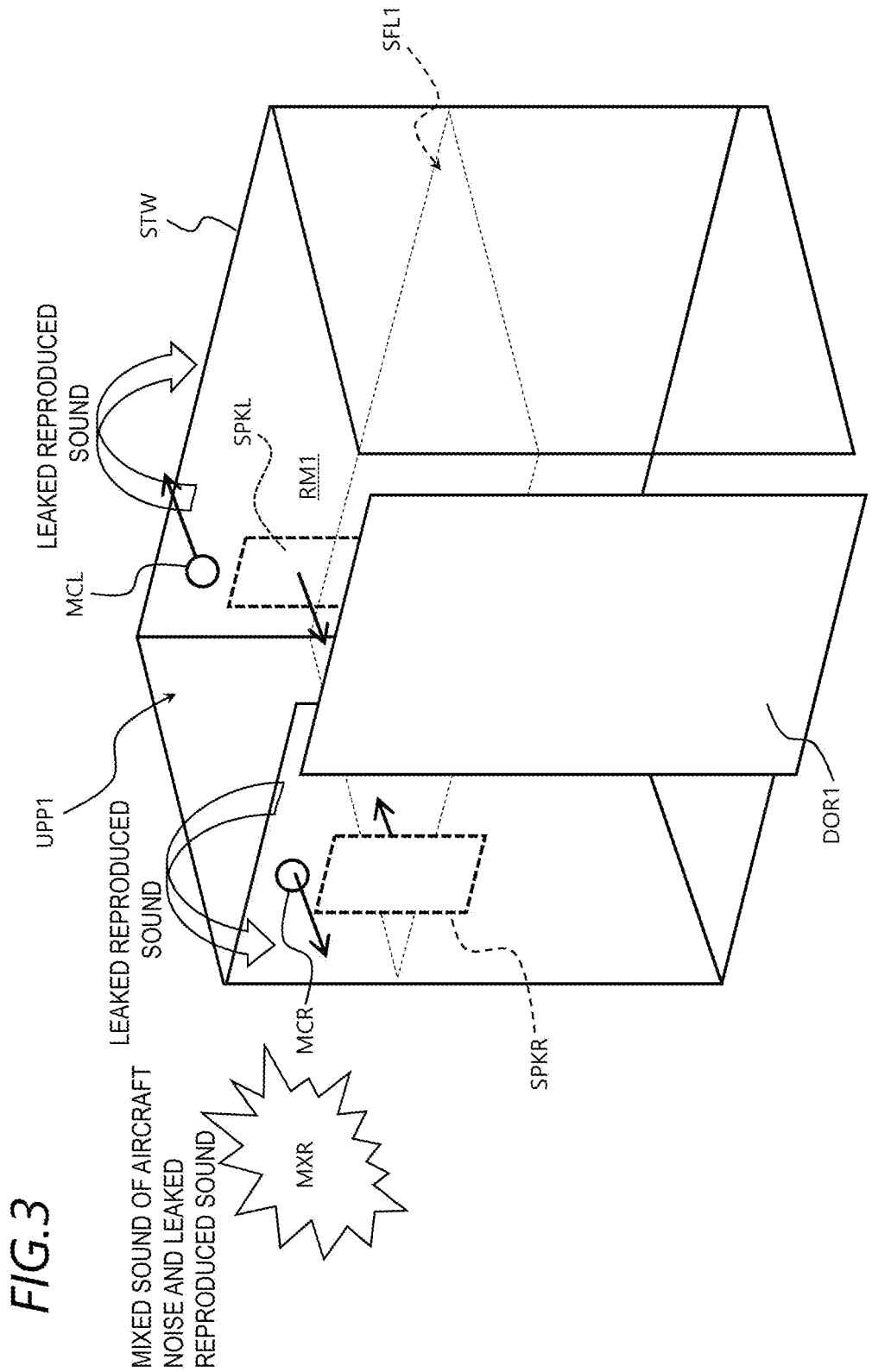
FIG. 3 illustrates an arrangement example of microphones and speakers in a target room of a cabin B provided in the aircraft.
Figure 4:
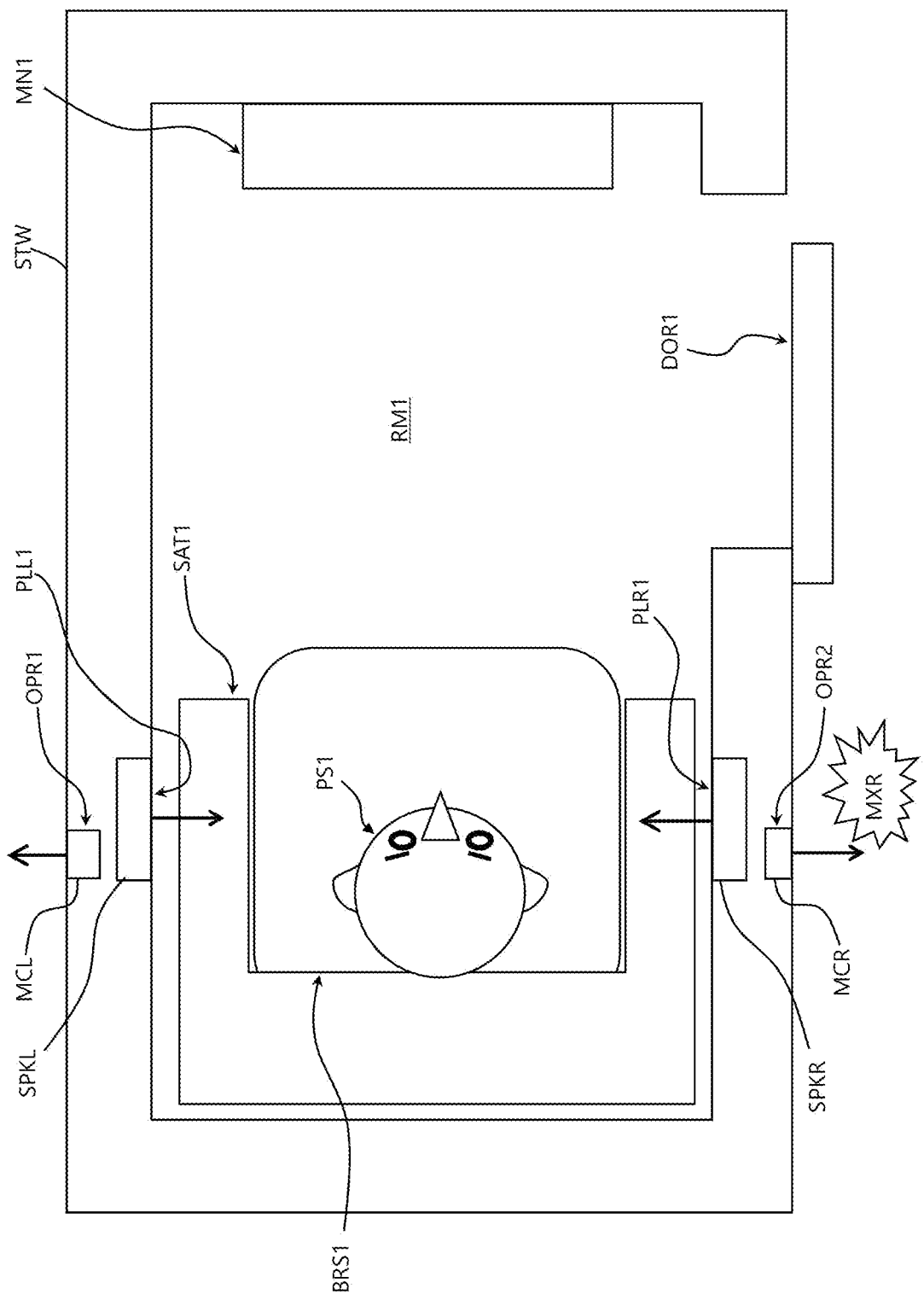
FIG. 4 is a plan view of the target room of the cabin B provided in the aircraft as viewed from above.
Figure 5:
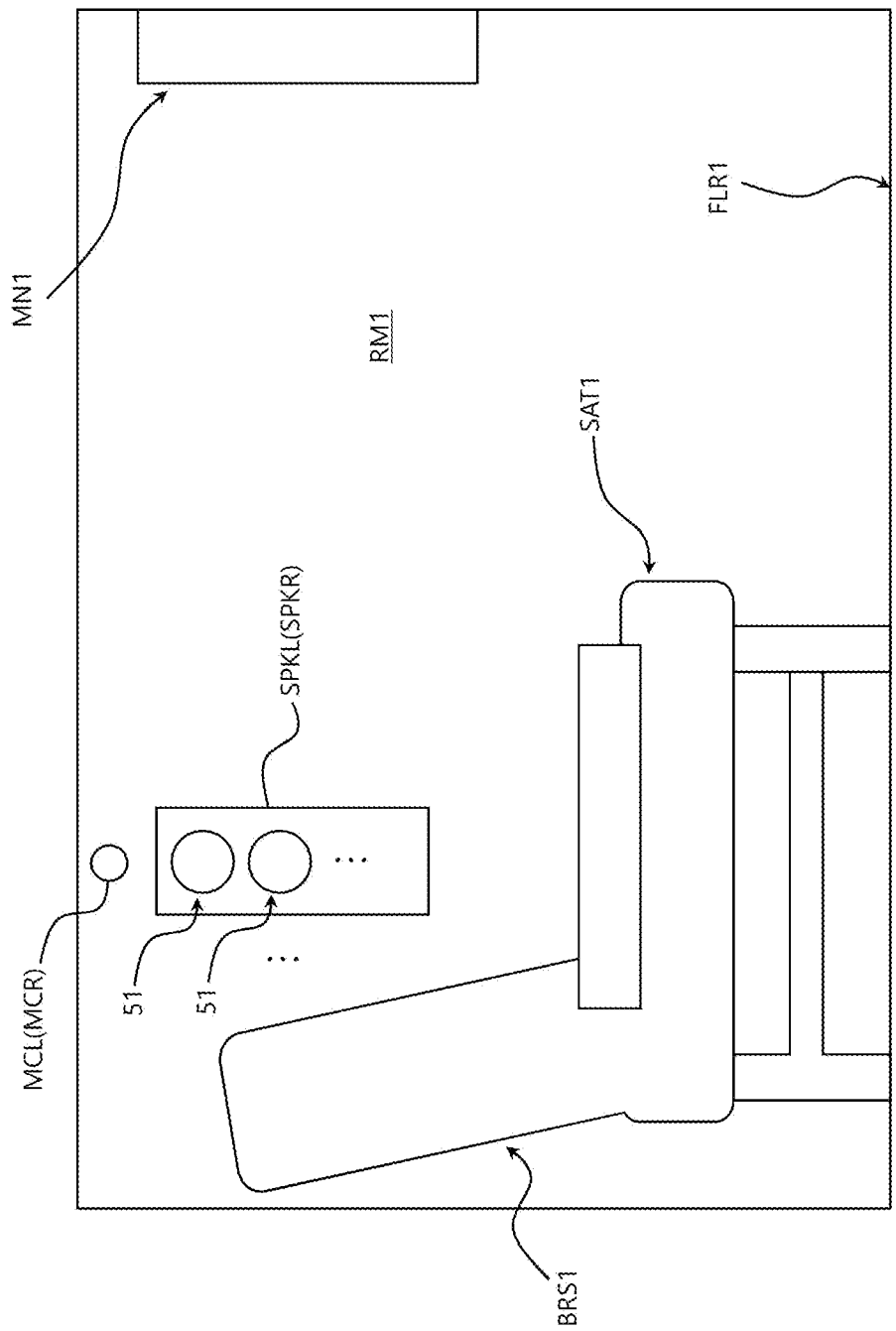
FIG. 5 is a perspective view of the target room of the cabin B provided in the aircraft as viewed from a side surface.

FIG. 3 is a diagram illustrating an arrangement example of microphones MCL, MCR and speakers SPKL, SPKR in a target room of the cabin B provided in the aircraft 100. FIG. 4 is a plan view of a target room RM1 of the cabin B provided in the aircraft 100 as viewed from above. FIG. 5 is a perspective view of the target room RM1 of the cabin B provided in the aircraft 100 as viewed from a side surface. For the target room RM1 illustrated in FIGS. 3 to 5, one in the seat row 103b arranged in the cabin B illustrated in FIG. 1 is shown as an example, and one in the seat row 103a arranged in the cabin A illustrated in FIG. 1 may be shown as an example.

As shown in FIG. 3, the target room RM1 is provided so as to be separable from target rooms for other passengers by a peripheral wall STW having a thickness equal to or greater than a predetermined value (cm) that is provided so as to surround a seat SAT1 on which a passenger PS1 who is a user sits. An upper portion UPP 1 of the peripheral wall STW is opened for safety inspection or the like of the aircraft 100 by cabin attendant (CA). Further, in the target room RM1, the speakers SPKL, SPKR are incorporated and fixed inside the peripheral wall STW so as to face a seat SAT1 side in the target room RM1 (see FIG. 4), and can output a reproduced sound of content from a sound source (for example, an information display terminal 20 illustrated in FIG. 6). In addition, in the target room RM1, the microphones MCL, MCR are respectively provided above the speakers SPKL, SPKR and toward the outside of the peripheral wall STW (see FIG. 5), and collect an environmental sound around the peripheral wall STW in the aircraft 100 (for example, mixed sound MXR which is a sound obtained by mixing the aircraft noise and a leaked reproduced sound output from each of the speakers SPKL, SPKR and exceeding the peripheral wall STW). In order to simplify entry and exit of the passenger PS1 into and from the target room RM1 illustrated in FIG. 3, a door DOR1 is movably attached.

As shown in FIG. 4, the microphones MCL, MCR are respectively accommodated and disposed in notched opening portions OPR1, OPR2 for microphone arrangement provided in advance in the peripheral wall STW. The seat SAT1 on which the passenger PS1 sits is provided with a backrest BRS1 such that the passenger PS1 can spend time comfortably. In the target room RM1, a monitor MN1 of an information display terminal 20 (see FIG. 6) is disposed in a front direction of the passenger PS1 when the passenger PS1 sits on the seat SAT1.

Figure 6:
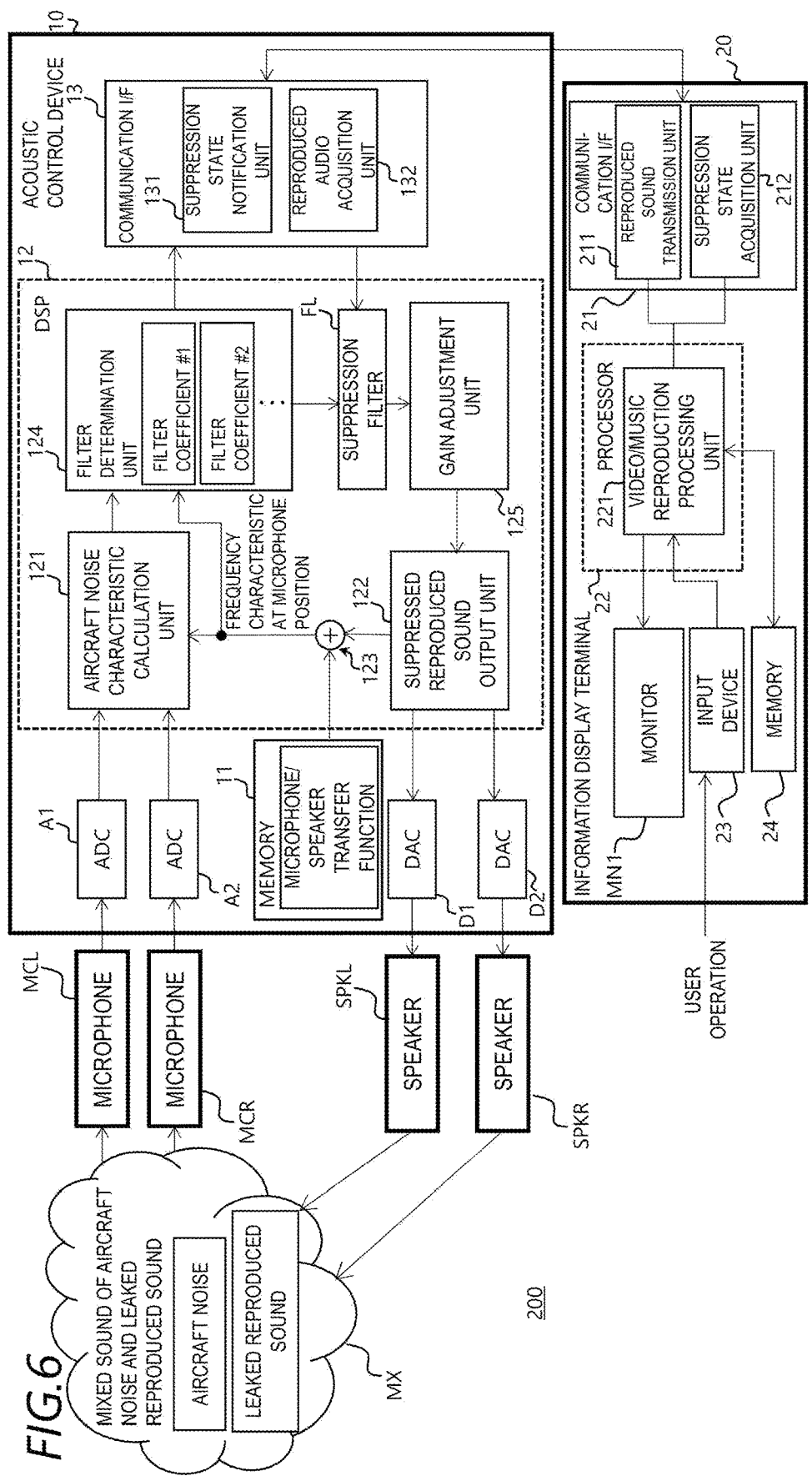
FIG. 6 illustrates an example of an internal configuration of the acoustic control system according to a first embodiment.

FIG. 6 is a diagram illustrating an example of an internal configuration of the acoustic control system 200 according to the first embodiment. The acoustic control system 200 includes the microphones MCL, MCR, the speakers SPKL, SPKR, an acoustic control device 10, and the information display terminal 20. The microphones MCL, MCR are connected to the acoustic control device 10, the speakers SPKL, SPKR are connected to the acoustic control device 10, and the acoustic control device 10 and the information display terminal 20 are connected to each other, so that data signals can be input and output therebetween. Since the microphones MCL, MCR have the same configuration, the microphone MCL will be described as an example. Similarly, since the speakers SPKL, SPKR have the same configuration, the speaker SPKL will be described as an example. Further, in the acoustic control system 200, an arrangement number of the microphones and the speakers may be one or three or more, but in order to make the description easy to understand, an example will be described in which one microphone and one speaker are disposed on each of left and right sides as viewed from the passenger PS1.

The microphone MCL collects the environmental sound around the peripheral wall STW (for example, the mixed sound MXR obtained by mixing the aircraft noise and the leaked reproduced sound output from each of the speakers SPKL, SPKR and exceeding the peripheral wall STW. The same applies hereafter). A data signal of the environmental sound collected by the microphone MCL is input to the acoustic control device 10.

The speaker SPKL acoustically outputs a content audio signal (content reproduced sound) after being suppressed by the acoustic control device 10, so that the sound leakage does not occur outside the target room RM1. Hereinafter, the content audio signal output from each of the speakers SPKL, SPKR is referred to as a "content reproduced sound".

The acoustic control device 10 includes analog digital (AD) converters A1, A2, a memory 11, digital analog (DA) converters D1, D2, a digital signal processor (DSP) 12, and a communication interface (I/F) 13. Since the AD converters A1, A2 have the same configuration, the AD converter A1 will be described as an example, and a description of the AD converter A1 can also be applied to the AD converter A2 by replacing A1 with A2. Similarly, since the DA converters D1, D2 have the same configuration, the DA converter D1 will be described as an example, and a description of the DA converter D1 can also be applied to the DA converter D2 by replacing D1 with D2.

The AD converter A1 receives a data signal of an environmental sound (for example, the mixed sound MXR) in an analog format collected by the microphone MCL, performs AD conversion on the data signal, and transmits the data signal of the environmental sound (for example, mixed sound MXR) in a digital format to the DSP 12.

The memory 11 includes, for example, a random access memory (RAM) and a read only memory (ROM). The RAM functions as a work memory of the DSP 12, and temporarily stores data signals generated or acquired by the DSP 12. The ROM stores programs and control data necessary for the DSP 12 executing various processes. The memory 11 may include a storage medium such as a flash memory, a hard disk drive (HDD), and a solid state drive (SSD) in addition to the RAM and the ROM.

In addition, the memory 11 stores a microphone/speaker transfer function indicating how an audio signal propagates and changes (for example, attenuates) between a microphone and a speaker in a frequency domain. The microphone/speaker transfer function is artificially measured in advance for each combination of the microphones MCL, MCR and the speakers SPKL, SPKR. Specifically, the microphone/speaker transfer function includes characteristic data indicating a transfer function of an audio signal between the microphone MCL and the speaker SPKL, characteristic data indicating a transfer function of an audio signal between the microphone MCL and the speaker SPKR, characteristic data indicating a transfer function of an audio signal between the microphone MCR and the speaker SPKL, and characteristic data indicating a transfer function of an audio signal between the microphone MCR and the speaker SPKR. As described above, the number of pieces of characteristic data included in the microphone/speaker transfer function is determined according to the number of microphones and speakers and the number of combinations of the microphones and the speakers.

The DA converter D1 receives the data signal of the content reproduced sound in the digital format after being suppressed by the DSP 12 so as not to cause the sound leakage outside the target room RM1, performs DA conversion on the data signal, and transmits the data signal of the content reproduced sound in the analog format to the speaker SPKL.

The DSP 12 functions as a controller that administrates overall operations of the acoustic control device 10, and performs control processing for integrally controlling operations of the components of the acoustic control device 10, data input and output processing to and from the components of the acoustic control device 10, data arithmetic processing, and data storage processing. Instead of the DSP 12, for example, a processor such as a central processing unit (CPU) or a field programmable gate array (FPGA) may be used. The DSP 12 operates according to the programs and the control data stored in the memory 11. The DSP 12 uses the memory 11 at the time of operation, and temporarily stores the data signals generated or acquired by the DSP 12 in the memory 11. The DSP 12 functionally or physically includes an aircraft noise characteristic calculation unit 121, a suppressed reproduced sound output unit 122, an arithmetic unit 123, a filter determination unit 124, a suppression filter FL, and a gain adjustment unit 125.

The aircraft noise characteristic calculation unit 121 calculates, based on the data signal of the environmental sound (for example, the mixed sound MXR) output from the AD converters A1, A2, a frequency characteristic (see FIG. 2) of the aircraft noise included in the mixed sound MXR by removing the content reproduced sound at a microphone position output from the arithmetic unit 123, and transmits the frequency characteristic to the filter determination unit 125.

The suppressed reproduced sound output unit 122 outputs the content reproduced sound suppressed by the suppression filter FL or the content reproduced sound suppressed by the suppression filter FL and subjected to gain adjustment by the gain adjustment unit 125 to each of the arithmetic unit 123 and the DA converters D1, D2.

The arithmetic unit 123 convolves the characteristic data of each microphone/speaker transfer function read from the memory 11 to the content reproduced sound from the suppressed reproduced sound output unit 122, thereby calculating the frequency characteristic of the content reproduced sound from each of the speakers SPKL, SPKR at each microphone position of the microphones MCL, MCR. The output of the arithmetic unit 123 is input to each of the aircraft noise characteristic calculation unit 121 and the filter determination unit 124.

The filter determination unit 124 determines whether to update a filter coefficient of the suppression filter FL based on the frequency characteristic of the aircraft noise from the aircraft noise characteristic calculation unit 121 and the frequency characteristic of the content reproduced sound at the microphone position from the arithmetic unit 123. That is, the filter determination unit 124 determines to update or maintain the filter coefficient of the suppression filter FL by using a comparison result between the frequency characteristic of the aircraft noise and the frequency characteristic of the content reproduced sound at the microphone position. Specifically, in each of a plurality of sub-frequency bands obtained by equally dividing, for example, an operation frequency band, the filter determination unit 124 updates the filter coefficient of the suppression filter that can suppress the content reproduced sound in a corresponding sub-frequency band, so that the sound pressure level of the content reproduced sound at the microphone position does not exceed the sound pressure level of the aircraft noise.

Here, the suppression filter FL is, for example, a finite impulse response (FIR) filter that includes multi-stage taps and can freely set the filter coefficient of each tap. The update of filter coefficients #1, #2, and so on is implemented by a predetermined algorithm (for example, least mean square (LMS)). The filter determination unit 124 sends, to the communication I/F 13, an instruction for sending a notification (for example, see a message MSG1 in FIG. 12 described later) indicating a state in which the sound pressure level of the content reproduced sound is suppressed by the suppression filter FL.

The suppression filter FL is a suppression filter of which the filter coefficient is updated by the filter determination unit 124 or the filter coefficient is maintained. The suppression filter FL suppresses the content reproduced sound acquired from the communication I/F 13 in the corresponding frequency band by using the output of the filter determination unit 124, and transmits the suppressed content reproduced sound to the gain adjustment unit 125.

The gain adjustment unit 125 adjusts a gain of the content reproduced sound after being suppressed by the suppression filter FL, and sends the content reproduced sound to the suppressed reproduced sound output unit 122. The adjustment of the gain performed by the gain adjustment unit 125 may be omitted.

The communication I/F 13 is a communication circuit for transmitting and receiving the data signals between the acoustic control device 10 and the information display terminal 20, and functionally includes a suppression state notification unit 131 and a reproduced audio acquisition unit 132.

The suppression state notification unit 131 receives the instruction, from the filter determination unit 124, for sending the notification (for example, see the message MSG1 in FIG. 12 described later) indicating the state in which the sound pressure level of the content reproduced sound is suppressed, and sends the instruction to the information display terminal 20.

The reproduced audio acquisition unit 132 receives, from the information display terminal 20, the content reproduced sound to be output from the speakers SPKL, SPKR from the information display terminal 20 as a sound source, and transmits the content reproduced sound to the DSP 12. The content reproduced sound is input to the suppression filter FL.

The information display terminal 20 includes a communication I/F 21, a processor 22, an input device 23, a memory 24, and the monitor MN1.

The communication I/F 21 is a communication circuit for transmitting and receiving the data signals between the information display terminal 20 and the acoustic control device 10, and functionally includes a reproduced sound transmission unit 211 and a suppression state acquisition unit 212.

The reproduction sound transmission unit 211 transmits, to the acoustic control device 10, a data signal of a content reproduced sound for each content read from the memory 24 by the processor 22 based on a user operation performed on the input device 23.

The suppression state acquisition unit 212 receives the instruction, from the acoustic control device 10, for sending the notification (for example, see the message MSG1 in FIG. 12 described later) indicating the state in which the sound pressure level of the content reproduced sound is suppressed, and sends the instruction to the processor 22.

The processor 22 functions as a controller that administrates overall operations of the information display terminal 20, and performs control processing for integrally controlling operations of the components of the information display terminal 20, data input and output processing to and from the components of the information display terminal 20, data arithmetic processing, and data storage processing. The processor 22 operates according to programs and control data stored in the memory 24. The processor 22 uses the memory 24 at the time of operation, and temporarily stores data signals generated or acquired by the processor 22 in the memory 24. The processor 22 functionally includes a video/music reproduction processing unit 221.

The video/music reproduction processing unit 221 outputs (reproduces), to the monitor MN1, a video data signal of content selected based on a user operation performed on the input device 23, and sends a data signal of a content reproduced sound of the content to the communication I/F 21.

The input device 23 is a device capable of detecting input of a user operation, and is, for example, a remote controller. The input device 23 may be another device that is not the remote controller as long as the input device 23 is the device capable of detecting the input of a user operation.

The memory 24 includes, for example, the RAM and the ROM. The RAM functions as a work memory of the processor 22, and temporarily stores the data signals generated or acquired by the processor 22. The ROM stores the programs and the control data necessary for the processor 22 executing various processes. The memory 24 may include a storage medium such as a flash memory, an HDD, and an SSD in addition to the RAM and the ROM.

The monitor MN1 is, for example, a liquid crystal display (LED) or an organic electroluminescence (EL) display device. The monitor MN1 outputs (reproduces) the video data signal sent from the processor 22. In addition, the monitor MN1 may display the notification (for example, see the message MSG1 in FIG. 12 described later) indicating the state in which the sound pressure level of the content reproduced sound is suppressed by the acoustic control device 10. In this manner, the passenger PS1 can easily understand that the sound pressure level of the content reproduced sound is currently suppressed.

Figure 7:
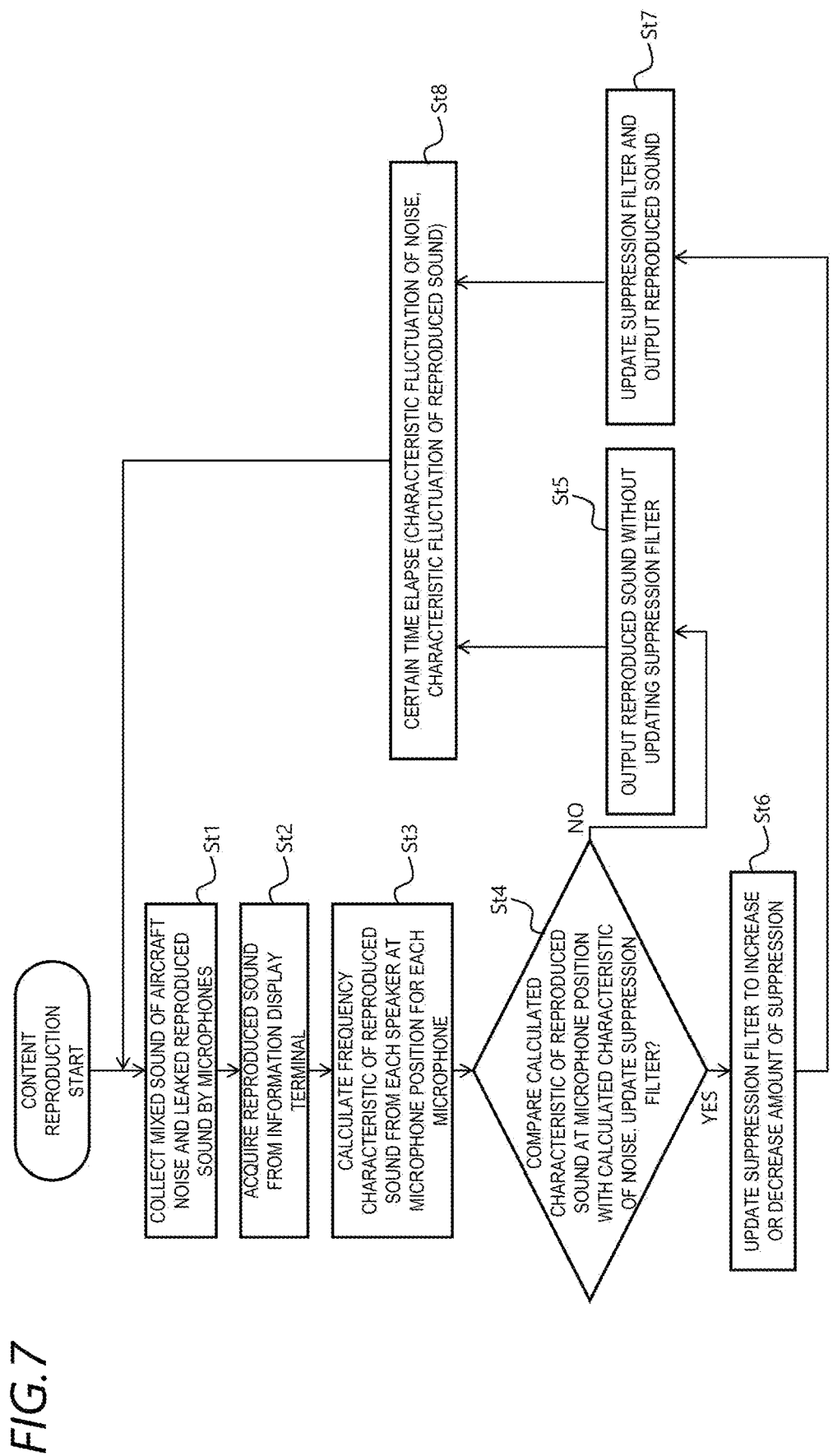
FIG. 7 is a flowchart that defines an example of an operation procedure of an acoustic control device according to the first embodiment in time series.
Figure 8:
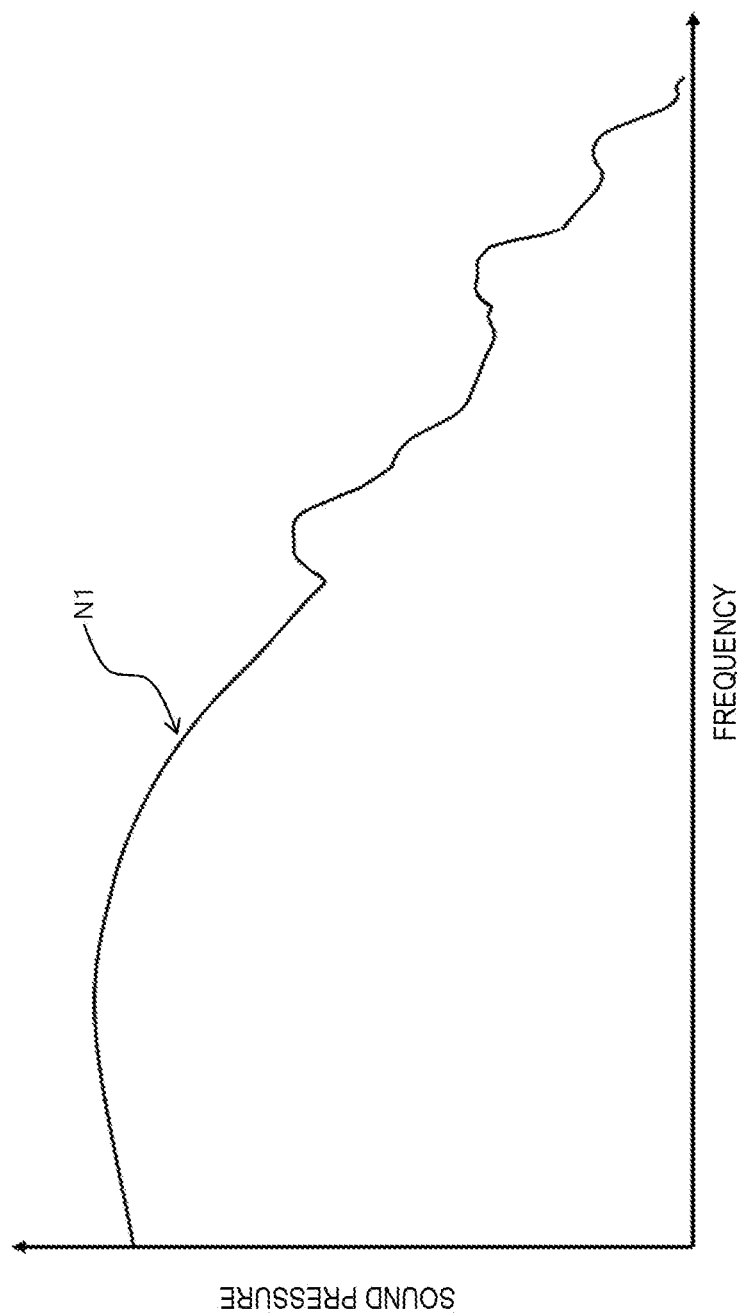
FIG. 8 illustrates a characteristic example of a mixed sound collected by one microphone.
Figure 9:
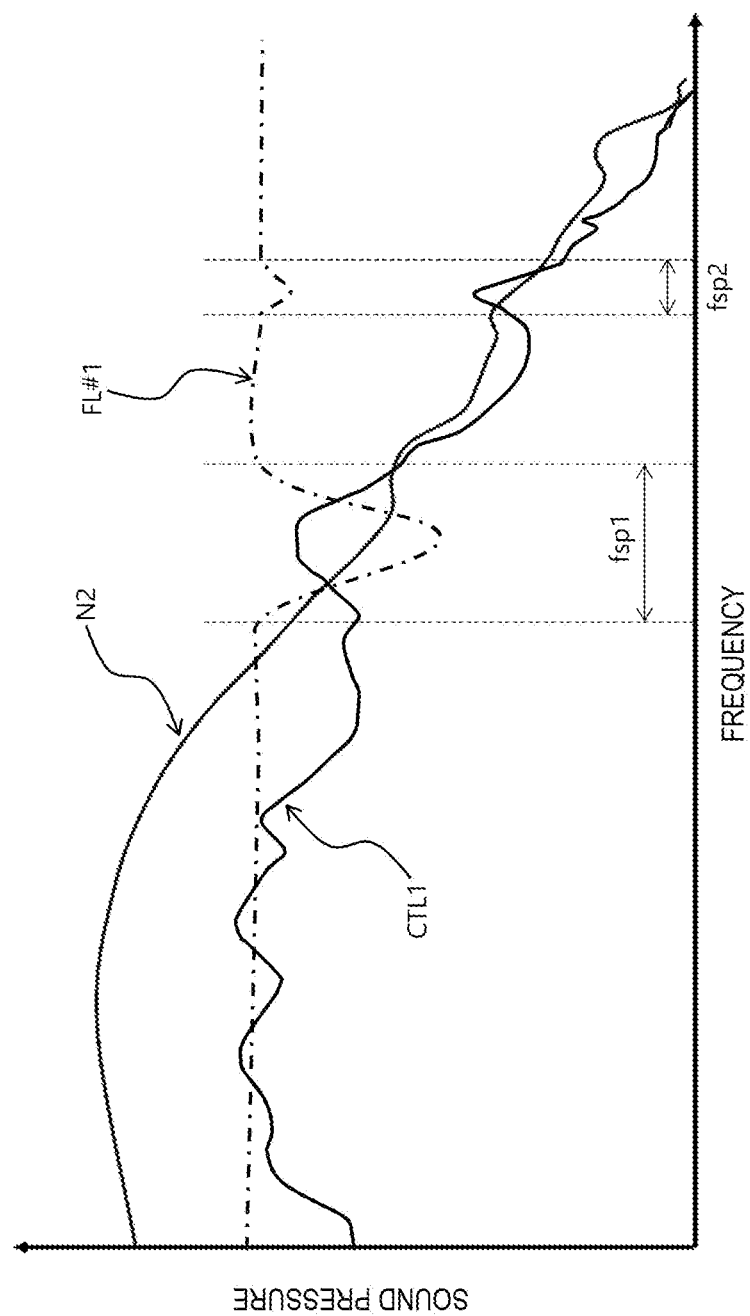
FIG. 9 illustrates a characteristic example of a mixed sound collected by one microphone, a characteristic example of a reproduced sound that can be output from one speaker, and a characteristic example of a first suppression filter.
Figure 10:
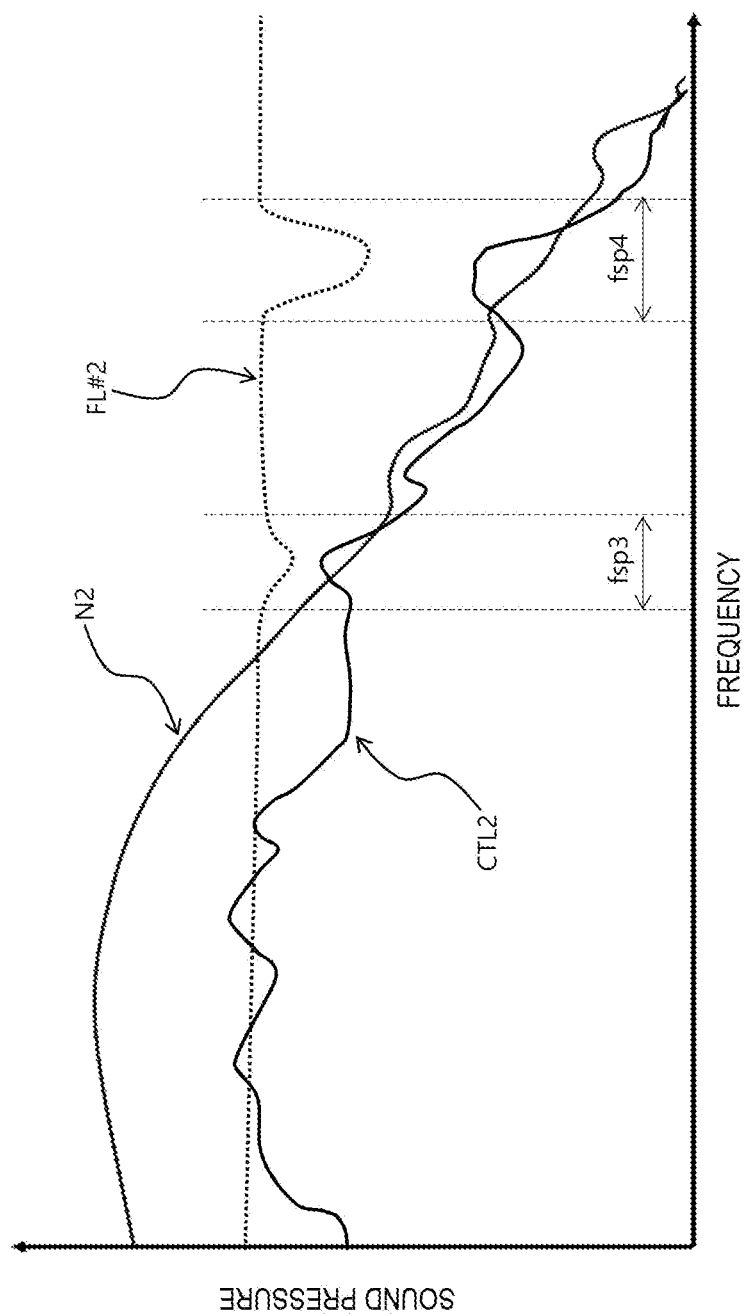
FIG. 10 illustrates the characteristic example of the mixed sound collected by one microphone, a characteristic example of a reproduced sound that can be output from the other speaker, and a characteristic example of a second suppression filter.
Figure 11:
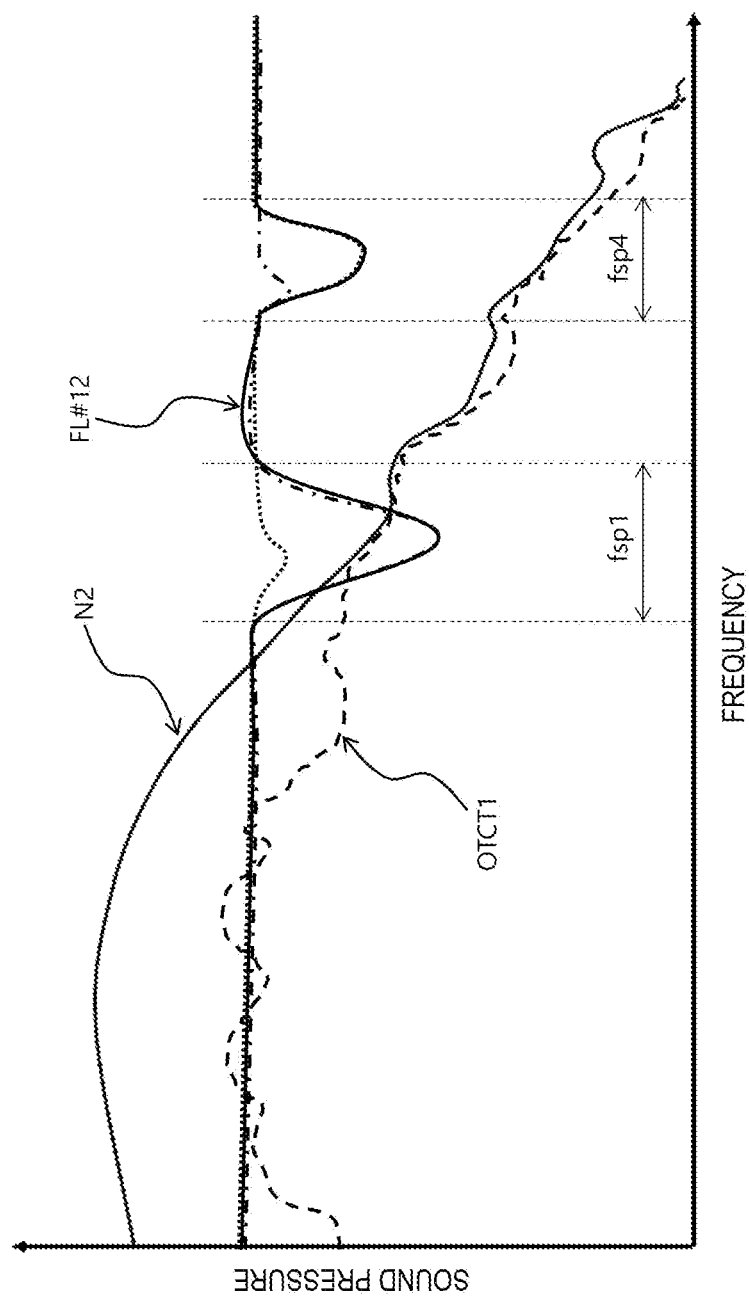
FIG. 11 illustrates a characteristic example of a suppression filter generated based on the first suppression filter and the second suppression filter, and a characteristic example of a reproduced sound after being subjected to suppression by the suppression filter output at one microphone position.

Next, an example of an operation procedure of the acoustic control system 200 according to the first embodiment will be described with reference to FIGS. 7, 8, 9, 10, and 11. FIG. 7 is a flowchart that defines an example of an operation procedure of the acoustic control device 10 according to the first embodiment in time series. FIG. 8 is a diagram illustrating a characteristic example of a mixed sound collected by one microphone. FIG. 9 is a diagram illustrating a characteristic example of a mixed sound collected by one microphone, a characteristic example of a reproduced sound that can be output from one speaker, and a characteristic example of a first suppression filter. FIG. 10 is a diagram illustrating the characteristic example of the mixed sound collected by one microphone, a characteristic example of a reproduced sound that can be output from the other speaker, and a characteristic example of a second suppression filter. FIG. 11 is a diagram illustrating a characteristic example of a suppression filter generated based on the first suppression filter and the second suppression filter, and a characteristic example of a reproduced sound after being suppressed by the suppression filter output at one microphone position.

Hereinafter, in the description of FIG. 7, each of FIGS. 8 to 11 will be referred to as necessary. A horizontal axis of each of FIGS. 8 to 11 represents the frequency, and a vertical axis of each of FIGS. 8 to 11 represents the sound pressure level. In the examples of FIGS. 8 to 11, the microphone MCL is described as an example of one microphone, but operations of the 20 acoustic control system 200 is similarly performed on a mixed sound collected by the microphone MCR.

In FIG. 7, each of the microphones MCL, MCR collects an environmental sound (for example, the mixed sound MXR which is the sound obtained by mixing the aircraft noise and the leaked reproduced sound output from each of the speakers SPKL, SPKR and exceeding the peripheral wall STW) (step St1). A signal of the collected environmental sound has, for example, a frequency characteristic N1 shown in FIG. 8, and is input to the acoustic control device 10. Similarly to the description of FIG. 2, in the frequency characteristic N1 of the environmental sound shown in FIG. 8, the sound pressure level in the low-frequency range portion is high, and the sound pressure level gradually decreases from the mid-frequency range portion to the high-frequency range portion.

The acoustic control device 10 receives and acquires, from the information display terminal 20, a data signal (in other words, a reproduced sound of content or the like from a sound source) of a content reproduced sound of content such as a movie that is input based on a user operation of the passenger PS1 (step St2).

The DSP 12 of the acoustic control device 10 calculates a frequency characteristic of the content reproduced sound from each of the left and right speakers at the microphone position for each of the left and right microphones by convoluting each of four pieces of characteristic data of the microphone/speaker transfer function read from the memory 11 to the content reproduced sound acquired in step St2 (step St3). In step St3, the frequency characteristics of a total of four content reproduced sounds are calculated based on, for example, two microphones MCL, MCR and two speakers SPKL, SPKR. The DSP 12 of the acoustic control device 10 calculates, based on the data signal of the input environmental sound (for example, the mixed sound MXR), a frequency characteristic of the aircraft noise included in the mixed sound MXR by removing each of the four content reproduced sounds calculated in step St3 at the microphone position. That is, the calculated frequency characteristics of the aircraft noise include those calculated based on the mixed sound MXR collected by the microphone MCL and those calculated based on the mixed sound MXR collected by the microphone MCR.

For example, FIG. 9 illustrates the frequency characteristics of the aircraft noise calculated based on the mixed sound MXR collected by the microphone MCL, but not the frequency characteristics of the aircraft noise calculated based on the mixed sound MXR collected by the microphone MCR. Specifically, a frequency characteristic N2 of the aircraft noise calculated by the DSP 12 removing the content reproduced sound from each of the speakers SPKL, SPKR at the microphone position of the microphone MCL from the environmental sound (for example, mixed sound MXR) collected by the microphone MCL, a frequency characteristic CTL1 of the content reproduced sound reproduced from the speaker SPKL and collected at the microphone position of the microphone MCL, and a frequency band FL #1 suppressed by the suppression filter FL are illustrated.

For example, FIG. 10 illustrates the frequency characteristics of the aircraft noise calculated based on the mixed sound MXR collected by the microphone MCL, but not the frequency characteristics of the aircraft noise calculated based on the mixed sound MXR collected by the microphone MCR. Specifically, the frequency characteristic N2 of the aircraft noise calculated by the DSP 12 removing the content reproduced sound from each of the speakers SPKL, SPKR at the microphone position of the microphone MCL from the environmental sound (for example, mixed sound MXR) collected by the microphone MCL, a frequency characteristic CTL2 of the content reproduced sound reproduced from the speaker SPKR and collected at the microphone position of the microphone MCL, and a frequency band FL #2 suppressed by the suppression filter FL are illustrated.

Returning to FIG. 7, the DSP 12 of the acoustic control device 10 compares each of the calculated frequency characteristics of the aircraft noise with each of the frequency characteristics of the content reproduced sound at the microphone position calculated in step St3, and determines whether or not to update the filter coefficient of the suppression filter FL (step St4). When it is determined that there is no frequency band in which the sound pressure level of the frequency characteristic of the aircraft noise is lower than the sound pressure level of the frequency characteristic of the content reproduced sound at the microphone position (step St4, NO), the DSP 12 outputs the content reproduced sound from each of the speakers SPKL, SPKR without updating the filter coefficient of the suppression filter (step St5).

On the other hand, when it is determined that there is a frequency band in which the sound pressure level of the frequency characteristic of the aircraft noise is lower than the sound pressure level of the frequency characteristic of the content reproduced sound at the microphone position (step St4, YES), the DSP 12 updates the filter coefficient of the suppression filter so as to increase or decrease an amount of the suppression performed by the suppression filter FL (step St6). The increase of the amount of the suppression is performed when the sound leakage occurs from the target room RM1 toward the outside of the peripheral wall STW. The decrease of the amount of the suppression is performed when the aircraft noise temporarily increases or the content reproduced sound temporarily decreases. The DSP 12 suppresses the content reproduced sound by the suppression filter using the filter coefficient updated in step St6 and outputs the suppressed content reproduced sound from each of the speakers SPKL, SPKR (step St7).

After step St5 or step St7, when a certain time (for example, several seconds) elapses (step St8), the process of the acoustic control system 200 returns to step St1. It is expected that the characteristics of the aircraft noise and the characteristics of the content reproduced sound fluctuate before the certain time elapses.

A specific example of step St6 will be described with reference to FIGS. 9 to 11.

In FIG. 9, a sound pressure level of the frequency characteristic N2 of the aircraft noise is lower than a sound pressure level of the frequency characteristic CTL1 of the content reproduced sound collected at the microphone position of the microphone MCL and reproduced from the speaker SPKL in each of center frequency bands of frequency bands fsp1, fsp2. Therefore, there is a high possibility that the sound leakage occurs from the target room RM1 toward the outside of the peripheral wall STW. Therefore, the DSP 12 updates the filter coefficient #1 of the suppression filter FL, so that the sound pressure level of the frequency characteristic N2 of the aircraft noise does not become lower than the sound pressure level of the frequency characteristic CTL1 of the content reproduced sound collected at the microphone position of the microphone MCL and reproduced from the speaker SPKL in each of the frequency bands fsp1, fsp2.

In FIG. 10, the sound pressure level of the frequency characteristic N2 of the aircraft noise is lower than a sound pressure level of the frequency characteristic CTL2 of the content reproduced sound collected at the microphone position of the microphone MCL and reproduced from the speaker SPKR in each of center frequency bands of frequency bands fsp3, fsp4. Therefore, there is a high possibility that the sound leakage occurs from the target room RM1 toward the outside of the peripheral wall STW. Therefore, the DSP 12 updates the filter coefficient #2 of the suppression filter FL, so that the sound pressure level of the frequency characteristic N2 of the aircraft noise does not become lower than the sound pressure level of the frequency characteristic CTL2 of the content reproduced sound collected at the microphone position of the microphone MCL and reproduced from the speaker SPKR in each of the frequency bands fsp3, fsp4.

Therefore, the DSP 12 suppresses the content reproduced sound using a suppression characteristic FL #12 based on a combination of the filter coefficients #1 and #2 of the suppression filter FL (specifically, a suppression characteristic in the frequency band fsp1 and a suppression characteristic in the frequency band fsp4 that are maximum suppression characteristics obtained in all the operation frequency band) (see FIG. 11). As a result, a sound pressure level of a frequency characteristic OTCT1 of the content reproduced sound after being suppressed becomes equal to or lower than the sound pressure level of the frequency characteristic N2 of the aircraft noise from the low-frequency range to the high-frequency range, so that the sound leakage from the target room RM1 to the outside of the peripheral wall STW is less likely to occur.

Figure 12:
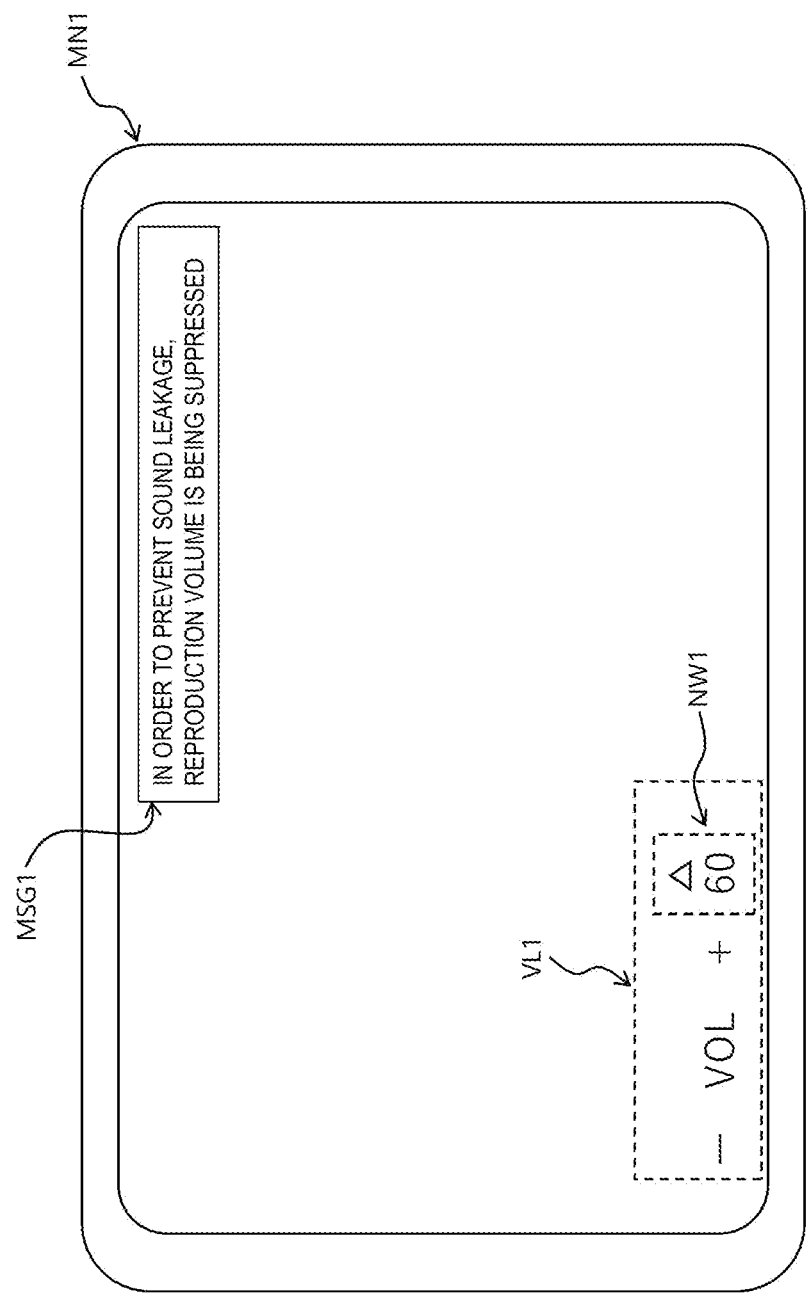
FIG. 12 illustrates a display example of a monitor in a case that a passenger performs an operation of increasing a sound volume while the suppression filter is effective.

FIG. 12 is a diagram illustrating a display example of the monitor MN1 when the passenger PS1 performs an operation of increasing a sound volume while the suppression filter FL is effective. In FIG. 12, illustration of content such as movies is omitted. When the passenger PS1 performs a user operation for increasing or decreasing a current sound volume value NW1 (for example, 60) in a sound volume display region VL1 displayed on the monitor MN1 by using the input device 23 such as a remote controller, the information display terminal 20 performs the following process. That is, when the user operation (see above) is detected by the input device 23 and the sound pressure level of the content reproduced sound is suppressed by the acoustic control device 10 using the suppression filter FL, the information display terminal 20 displays the notification (see, for example, the message MSG1 in FIG. 12) indicating the state in which the sound pressure level is suppressed. In this manner, the passenger PS1 can easily confirm that the sound pressure level of the content reproduced sound of the content such as a movie is being suppressed.

As described above, the acoustic control system 200 according to the first embodiment includes the peripheral wall STW which is provided so as to surround the seat SAT1 and in which the upper portion UPP1 is opened, the speakers SPKL, SPKR which are provided inside the peripheral wall STW so as to face the seat SAT1 and can output the reproduced sound from the sound source (for example, the information display terminal 20), the microphones MCL, MCR which are provided toward the outside of the peripheral wall STW and collect the environmental sound (for example, mixed sound MXR) around the peripheral wall STW, and the processor (for example, the DSP 12). The processor suppresses a level (for example, the sound pressure level) of the reproduced sound in a predetermined frequency band from the speakers SPKL, SPKR based on the environmental sound collected by the microphones MCL, MCR.

As a result, the acoustic control system 200 can suppress the sound pressure level of the reproduced sound of the content viewed by the user (for example, the passenger PS1) in the target room RM1 such as a semi-private room in which noise of the aircraft 100 or the like generates, and thus, the reproduced sound is prevented from being leaked exceeding the peripheral wall STW, and it is possible to effectively generate a reproduced sound field that allows the passenger PS1 to enjoy the content without wearing headphones or earphones.

In addition, the processor (for example, the DSP 12) generates an input signal (for example, aircraft noise) in which the reproduced sound at the positions of the microphones MCL, MCR from the speakers SPKL, SPKR are removed from the environmental sound, and suppresses the level of the reproduced sound in the predetermined frequency band based on the input signal and the reproduced sound at the positions of the microphones MCL, MCR. Accordingly, the acoustic control system 200 can suppress the sound pressure level of the reproduced sound by setting a frequency band in which the sound pressure level of the reproduced sound is higher than the sound pressure level of the aircraft noise as a predetermined frequency, and thus it is possible to prevent an occurrence of the sound leakage of the reproduced sound from the target room RM1 in which the passenger PS1 is present.

The microphones MCL, MCR are disposed above the speakers SPKL, SPKR. Accordingly, the microphones MCL, MCR can efficiently collect not only the content reproduced sound output from the speakers SPKL, SPKR but also the noise in the aircraft 100.

In addition, the processor (for example, the DSP 12) causes an external monitor (for example, the monitor MN1 of the information display terminal 20) to display an indicator (for example, the message MSG1) indicating that a process of suppressing the level of the reproduced sound output from the speakers SPKL, SPKR is being executed. In this manner, the passenger PS1 can easily confirm that the sound pressure level of the content reproduced sound of the content such as a movie is being suppressed.

In addition, the speakers SPKL, SPKR are array speakers having a plurality of speaker elements 51 arranged in a row in a gravity direction which is a direction perpendicular to a floor surface FLR1 on which the seat SAT1 is provided. Accordingly, since the speakers SPKL, SPKR can be configured as speakers having directivity, the content reproduced sound can be output with directivity directed to the passenger PS1.

The processor (for example, the DSP 12) includes a filter (for example, the suppression filter FL) capable of suppressing the level of the reproduced sound from the speakers SPKL, SPKR, and updates the filter so that the reproduced sound at the positions of the microphones MCL, MCR becomes smaller than the input signal. Accordingly, the acoustic control system 200 can suppress the sound pressure level of the content reproduced sound output from the speakers SPKL, SPKR at the positions of the microphones MCL, MCR, and thus it is possible to prevent the occurrence of the sound leakage of the reproduced sound from the target room RM1 in which the passenger PS1 is present.

In addition, when there are a plurality of frequency bands in which the reproduced sound at the positions of the microphones MCL, MCR is larger than the input signal, the processor (for example, the DSP 12) determines the suppression characteristics of the filter (for example, the suppression filter FL) by combining the amounts of the suppression corresponding to the respective frequency bands with the plurality of frequency bands as the predetermined frequency bands, and suppresses the level of the reproduced sound by the filter. Accordingly, even when there are a plurality of frequency bands in which the reproduced sound at the positions of the microphones MCL, MCR is larger than the aircraft noise, the acoustic control system 200 can suppress the sound pressure level of the reproduced sound to be smaller than that of the aircraft noise in all of the plurality of frequency bands, and thus it is possible to prevent the occurrence of the sound leakage of the reproduced sound from the target room RM1 in which the passenger PS1 is present.

Further, the microphone includes a first microphone (for example, the microphone MCL) disposed on the peripheral wall STW on the left side as viewed from the front direction of the seat SAT1, and a second microphone (for example, the microphone MCR) disposed on the peripheral wall STW on the right side as viewed from the front direction of the seat SAT. The processor (for example, the DSP 12) generates, as the input signals, a first input signal (for example, aircraft noise obtained by removing the reproduced sound at the position of the microphone MCL from the mixed sound collected at the position of the microphone MCL) obtained by removing the reproduced sound at a position of the first microphone from the speaker from the environmental sound and a second input signal (for example, aircraft noise obtained by removing the reproduced sound at the position of the microphone MCR from the mixed sound collected at the position of the microphone MCR) obtained by removing the reproduced sound at a position of the second microphone from the speaker from the environmental sound, and suppresses the level of the reproduced sound in a predetermined frequency band based on the input signals and the reproduced sound at the positions of the first microphone and the second microphone. As a result, in a case where the microphones are provided on both left and right sides as viewed from the seat SAT1 on which the passenger PS1 sits, the acoustic control system 200 can suppress the sound pressure level of the reproduced sound so that the sound pressure level of the reproduced sound at each microphone position from the speaker does not exceed the sound pressure level of the aircraft noise for each environmental sound collected by each of the microphones MCL, MCR, and thus it is possible to prevent the occurrence of the sound leakage of the reproduced sound from the target room RM1 in which the passenger PS1 is present.

Second Embodiment

In the acoustic control system 200 according to the first embodiment, a positional relationship between positions of the speakers SPKL, SPKR in the target room RM1 (see FIGS. 3 to 5) and the passenger PS1 sitting on the seat SAT1 is not particularly mentioned. In an acoustic control system according to a second embodiment, an arrangement example of the speakers SPKL, SPKR in which a content reproduced sound reproduced (output) from the speakers SPKL, SPKR are easily heard by the passenger PS1 in the target room RM1 will be described.

A configuration of the acoustic control system according to the second embodiment is the same as that of the acoustic control system 200 according to the first embodiment. Therefore, in the following description, contents different from those of the acoustic control system 200 according to the first embodiment will be described, the same components will be denoted by the same reference numerals, and the description thereof will be simplified or omitted.

Figure 13:
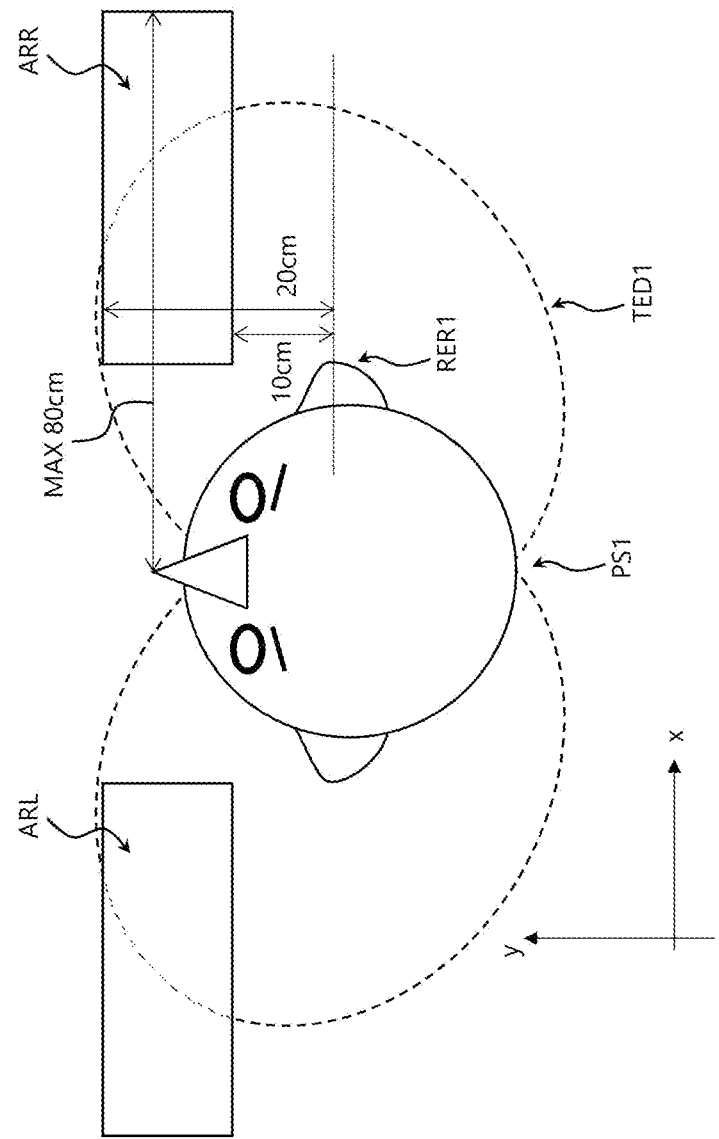
FIG. 13 illustrates directional characteristics of ears of a person in a high frequency band and areas in which the speakers can be installed.
Figure 14:
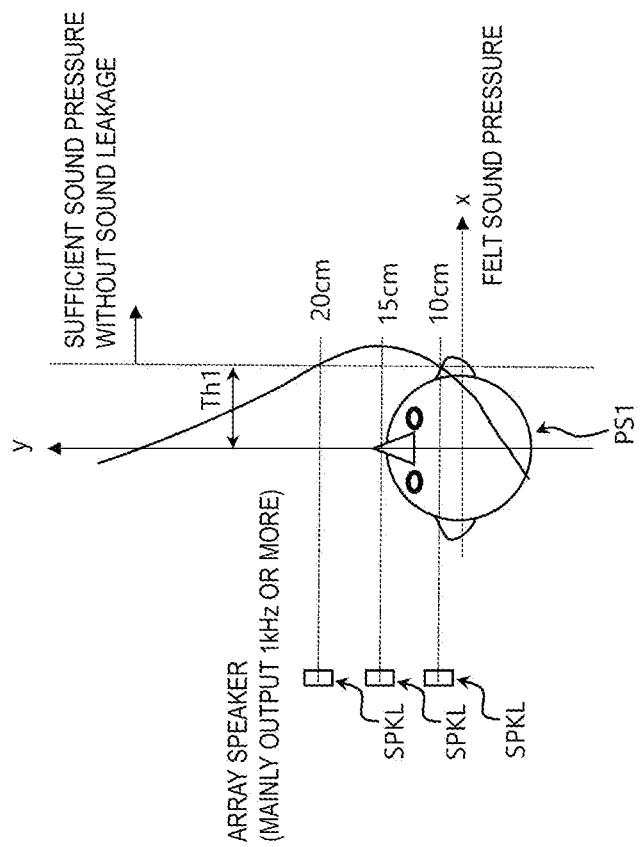
FIG. 14 shows an example of a relationship between installation positions of the speakers and characteristics of a sound pressure felt by a person.

FIG. 13 is a diagram illustrating directional characteristics of ears of a person in a high frequency band and areas in which the speakers SPKL, SPKR can be installed. FIG. 14 is a diagram illustrating an example of a relationship between installation positions of the speakers SPKL, SPKR and characteristics of a sound pressure felt by a person. In FIGS. 13 and 14, a front direction of a line of sight of the passenger PS1 when the passenger PS1 sits on the seat SAT1 is defined as a y-axis direction, and a direction orthogonal to the y-axis direction (in other words, a depth direction of the target room RM1) is defined as an x-axis direction.

FIG. 13 is a plan view of the passenger PS1 sitting on the seat SAT1 in the target room RM1 as viewed from above the head of the passenger PS1. A range TED 1 indicates a tendency of directional characteristics of left and right ears of the passenger PS1, and the directional characteristics (that is, the characteristics in which the audio signal easily reaches the ear) are more strongly distributed on a front side of the ears than on a rear side of the ears.

In the second embodiment, installation areas ARL, ARR of the speakers SPKL, SPKR are determined by taking advantage of such tendency of the directional characteristics of the ears. That is, in a case where a position of the passenger PS1 is fixed (that is, fixed to a position where the passenger sits on the seat SAT1), the installation area ARR indicates an installation area suitable for disposing the speaker SPKR. Similarly, in the case where the position of the passenger PS1 is fixed (that is, fixed to the position where the passenger sits on the seat SAT1), the installation area ARL indicates an installation area suitable for disposing the speaker SPKL. For example, it is desirable that the area ARR in the x-axis direction is apart from a right ear RER1 of the passenger PS1 and is apart from the nose of the passenger PS1 by 80 cm at the maximum in the +x-axis direction. In addition, it is desirable that the area ARR in the y-axis direction is apart from the right ear RER1 of the passenger PS1 by 10 cm and is apart from the right ear RER1 by 20 cm.

This is based on a fact that, as shown in FIG. 14, when the speaker SPKL, which is formed of the array speaker and apart from the ear of the passenger PS1 by a certain distance in the x-axis direction, is disposed so as to be movable in the y-axis direction and outputs an audio signal of 1 kHz or more, the passenger PS1 feels a sufficient sound pressure when the speaker SPKL is disposed between 10 cm and 20 cm in the y-axis direction. That is, when the audio signal of the speaker SPKL is output from positions that are respectively apart from the ear by 10 cm, 15 cm, 20 cm in the y-axis direction, in body sensing, the sound leakage does not occur and the passenger PS1 can feel a sufficient sound pressure. This is because the sound pressure level of the audio signal of the speaker SPKL from the positions that are respectively apart from the ear by 10 cm, 15 cm, 20 cm in the y-axis direction exceeds a threshold Th1 at the time when the audio signal reaches the ear of the passenger PS1. As described above, in the second embodiment, optimal arrangement of the speakers in the target room RM1 is determined while taking advantage of human auditory characteristics.

Figure 15:
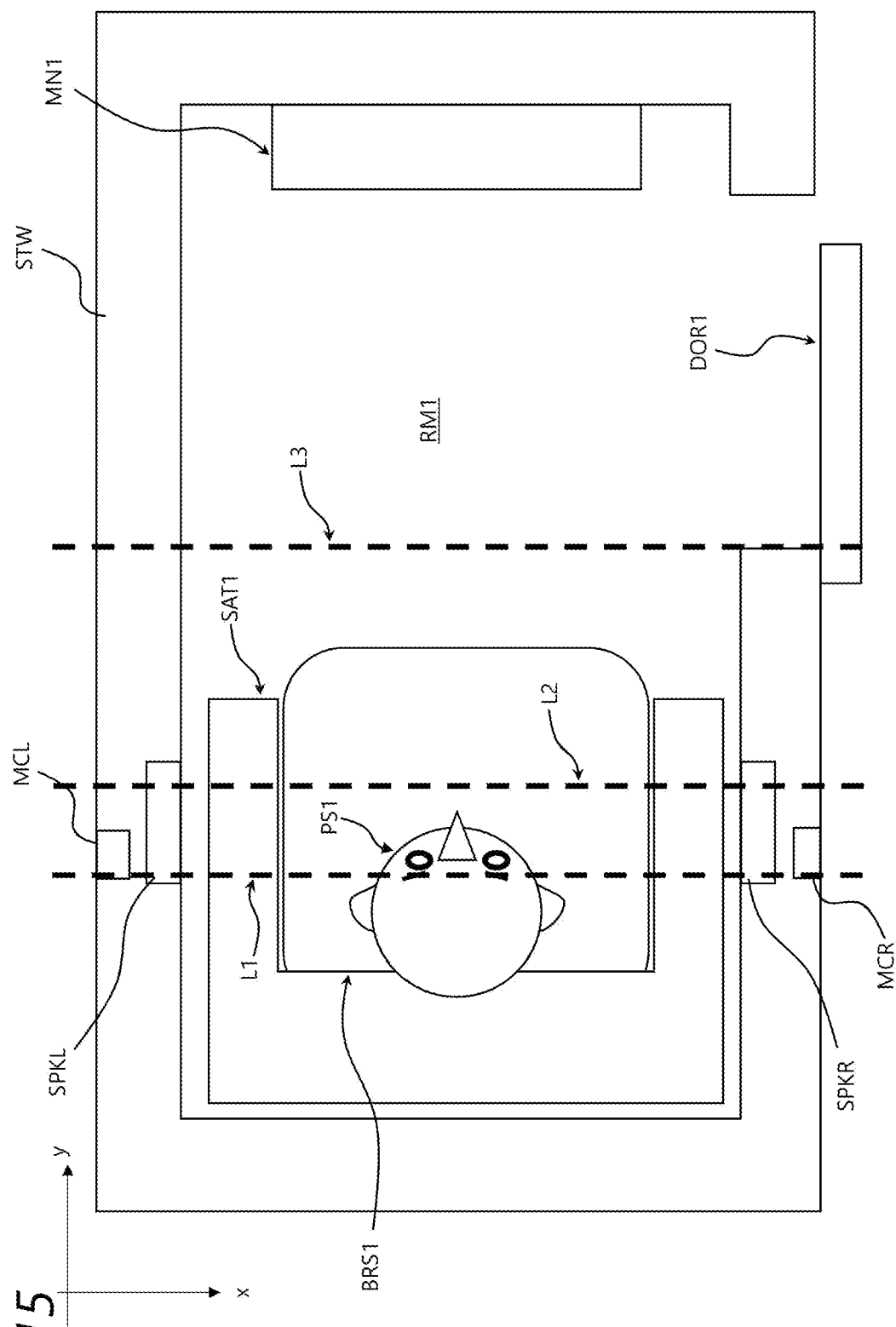
FIG. 15 illustrates an example of positions of the speakers installed on side walls of the cabin B provided in the aircraft.
Figure 16:
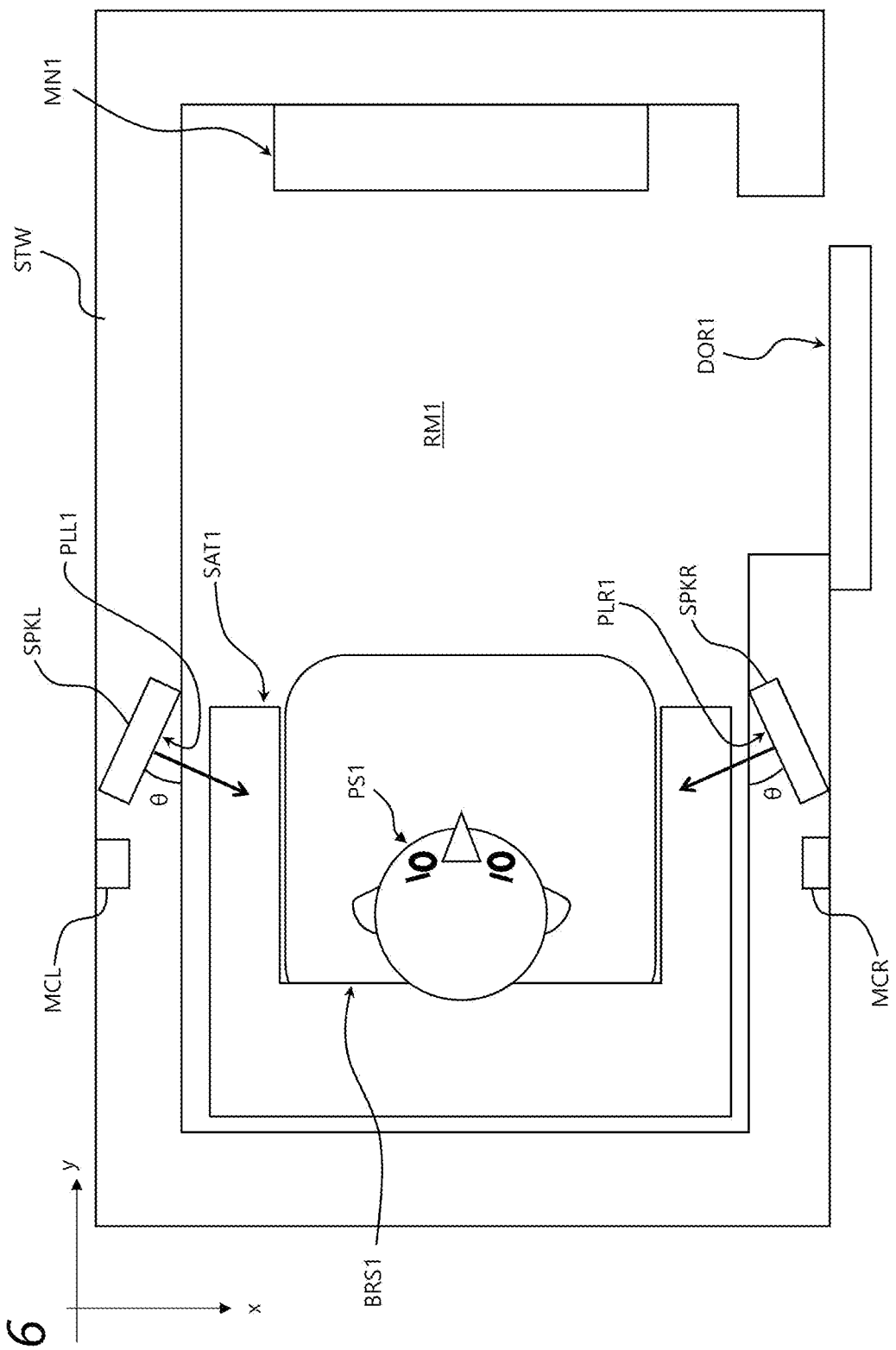
FIG. 16 illustrates an example of orientations of the speakers installed on the side walls of the cabin B provided in the aircraft.
Figure 17:
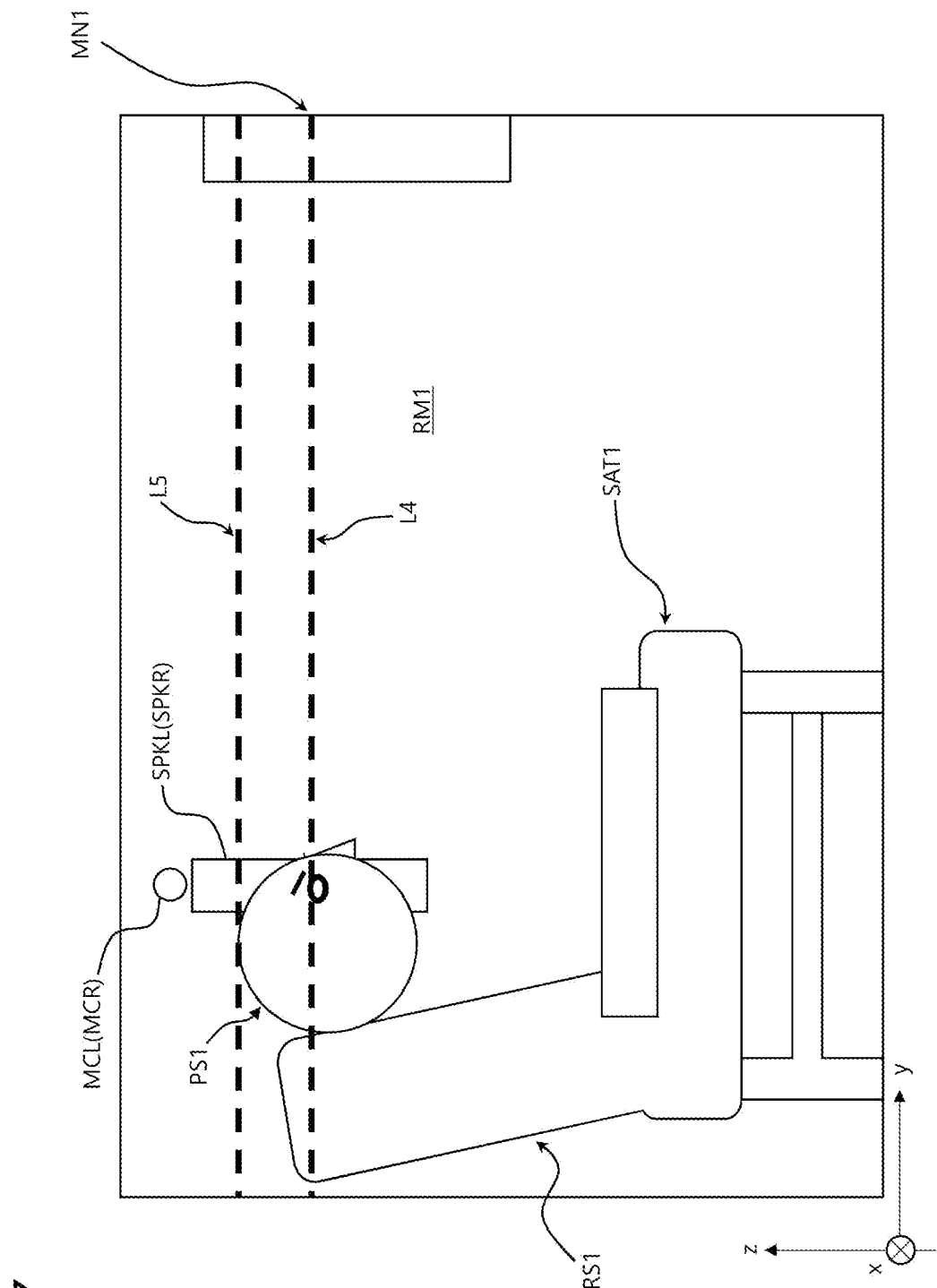
FIG. 17 illustrates the example of the positions of the speakers installed on the side walls of the cabin B provided in the aircraft.
Figure 18:
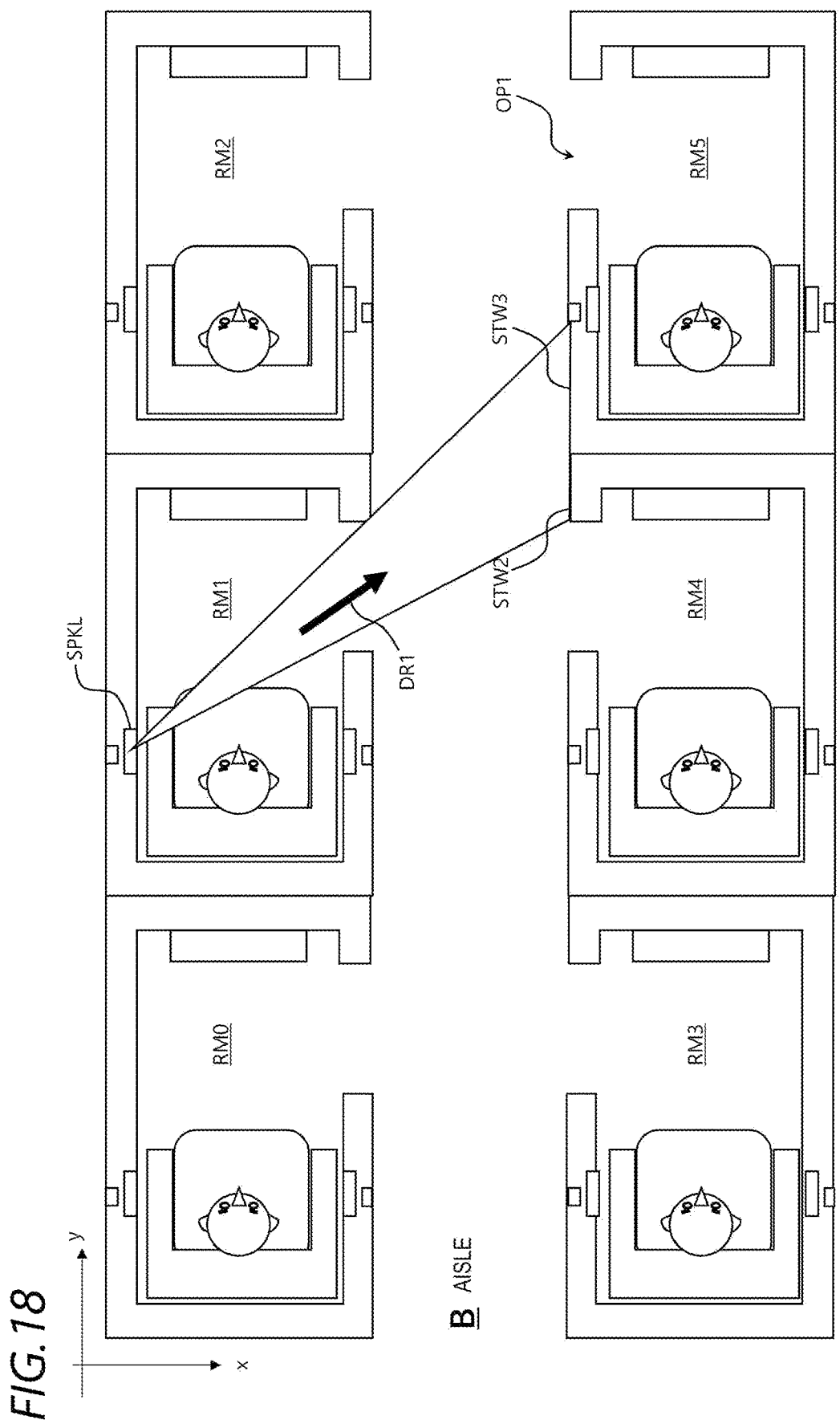
FIG. 18 illustrates a first layout example in which a plurality of seats of the cabin B in which no door is provided are arranged. 10

FIG. 15 is a diagram illustrating an example of positions of the speakers installed on side walls of the cabin B provided in the aircraft 100. FIG. 16 is a diagram illustrating an example of orientations of the speakers installed on the side walls of the cabin B provided in the aircraft 100. FIG. 17 is a diagram illustrating an example of positions of the speakers installed on side walls of the cabin B provided in the aircraft 100. FIG. 18 is a diagram illustrating a first layout example in which a plurality of seats of the cabin B in which no door is provided are arranged. FIG. 19 is a diagram illustrating a second layout example in which a plurality of seats of the cabin B in which no door is provided are arranged.

As illustrated in FIG. 15, in the second embodiment, each of the speakers SPKL, SPKR is provided behind (—y-axis direction) a front side (specifically, distinction line L3) of the door DOR1, and is provided in front of (+y-axis direction) the ears of the passenger PS1 about 10 cm (specifically, distinction line L1) to 20 cm (specifically, distinction line L2). With this arrangement, the passenger PS1 can, in body sensing, comfortably enjoy listening to the audio without wearing headphones or earphones by sufficiently listening to the content reproduced sound reproduced (output) from each of the speakers SPKL, SPKR.

In the second embodiment, the speakers SPKL, SPKR may be obliquely disposed in addition to the condition satisfying the arrangement example of FIG. 15 (see FIG. 16). Specifically, as illustrated in FIG. 16, each of the speakers SPKL, SPKR is obliquely inclined by an angle θ formed by audio output surfaces PLL1, PLR1 of the speakers SPKL, SPKR respectively being inclined with respect to a longitudinal direction (that is, the y-axis direction) of the peripheral wall STW, and each of the audio output surfaces PLL1, PLR1 is fixed so as to face the backrest BRS1. With this arrangement, since the audio output surfaces PLL1, PLR1 where the content reproduced sound is reproduced (output) from the speakers SPKL, SPKR face the passenger PS1, the passenger PS1 can comfortably enjoy listening to the audio without wearing headphones or earphones.

As illustrated in FIG. 17, each of the speakers SPKL, SPKR is disposed such that a center line passing through a center portion thereof (specifically, a center line L4 parallel to the y-axis direction and passing through the center portion) is located below the head of the passenger PS1 (specifically, an overhead line L5 parallel to the y-axis direction and passing above the head of the passenger PS1). With this arrangement, each of the speakers SPKL, SPKR configured with the array speakers can reduce a difference in distance between the ears of the passenger PS1 and a center of each of the speakers SPKL, SPKR, and thus can easily form directivity, and the passenger PS1 can comfortably enjoy listening to the audio without wearing headphones or earphones.

Next, in FIGS. 18 and 19, an example in which a plurality of semi-private room type (semi-private room structure) seats, which is a type of seat in which the door DOR1 is not provided, are arranged side by side in the y-axis direction will be described. In the example of FIG. 18, a three-seat row capable of respectively providing target rooms RM0, RM1, RM2 and a three-seat row capable of respectively providing target rooms RM3, RM4, RM5 are arranged with an aisle interposed therebetween. The peripheral wall STW around each of the target rooms RM0 to RM5 is provided with an opening portion through which a passenger enters and exits the target room.

In FIG. 18, for example, the speaker SPKL disposed in the seat capable of providing the target room RM1, the opening portion formed by cutting out a part of the peripheral wall STW of the corresponding seat, and peripheral walls STW2, STW3 of other seats (specifically, the seats corresponding to the target rooms RM4, RM5, respectively) exist on a straight line (in other words, in a direction DR1). That is, the speaker SPKL disposed in the seat capable of providing the target room RM1, the opening portion formed by cutting out a part of the peripheral wall STW of the corresponding seat, and opening portions of other seats (specifically, the seats corresponding to the target rooms RM4, RM5, respectively) exist on the straight line (in other words, in the direction DR1). As a result, even if the content reproduced sound output from the speaker SPKL disposed in the seat capable of providing the target room RM1 leaks to the aisle via the opening portion formed by cutting out a part of the peripheral wall STW of the corresponding seat, the content reproduced sound does not propagate via the opening portion of the seat used by another passenger, and thus it is possible to prevent an occurrence of a difference in content viewed by another passenger.

On the other hand, in FIG. 19, for example, the speaker SPKL disposed in the seat capable of providing the target room RM1, the opening portion formed by cutting out a part of the peripheral wall STW of the corresponding seat, and an opening portion OP1 provided on the peripheral wall STW4 of another seat (specifically, the seat corresponding to the target room RM5) exist on the straight line (in other words, in the direction DR1). Therefore, when the content reproduced sound output from the speaker SPKL disposed in the seat capable of providing the target room RM1 leaks to the aisle via the opening portion formed by cutting out a part of the peripheral wall STW of the corresponding seat, the content reproduced sound propagates via the opening portion OP1 of the seat used by another passenger (specifically, the passenger using the target room RM5), and thus the difference in the content viewed by another passenger may occur.

On the other hand, in FIG. 19, for the passenger in the target room RM4, similarly to FIG. 18, the speaker SPKL disposed in the seat capable of providing the target room RM1, the opening portion formed by cutting out a part of the peripheral wall STW of the corresponding seat, and the opening portion of the seat corresponding to the target room RM4 exist on the straight line. As a result, even if the content reproduced sound output from the speaker SPKL disposed in the seat capable of providing the target room RM1 leaks to the aisle via the opening portion formed by cutting out a part of the peripheral wall STW of the corresponding seat, the content reproduced sound does not propagate via the opening portion of the seat used by another passenger (specifically, the passenger using the target room RM4), and thus it is possible to prevent the occurrence of the difference in content viewed by the another passenger.

As described above, the audio device according to the second embodiment includes the peripheral wall STW which is provided so as to surround the seat SAT1 and in which the upper portion UPP1 is opened, and the speakers SPKL, SPKR which are provided inside the peripheral wall STW so as to face the seat SAT1 and can output the reproduced sound from the sound source (for example, the information display terminal 20). The speakers SPKL, SPKR are disposed in front of the ears of a person (for example, passenger PS1) sitting on the seat SAT1.

As a result, the audio device can make it easier for the passenger PS1 to hear the content reproduced sound reproduced (output) from the speakers SPKL, SPKR in the target room RM1 provided in a special semi-private room such as a business class or a first class of the aircraft 100 or the like.

The speakers SPKL, SPKR are disposed in front of the face of a person (for example, passenger PS1). Thus, the passenger PS1 can easily and clearly listen to the content reproduced sound reproduced (output) from the speakers SPKL, SPKR due to the tendency of the directional characteristics of the human ears.

The speakers SPKL, SPKR are disposed in front of the ears of a person (for example, passenger PS1) about 10 cm to 20 cm. As a result, in body sensing, the passenger PS1 easily and clearly hears the content reproduced sound reproduced (output) from the speakers SPKL, SPKR with sufficient sound pressure.

The peripheral wall STW has an entrance (for example, the door DOR1 or the opening portion) through which a person (for example, the passenger PS1) enters a space (for example, the target room RM1) covered by the peripheral wall STW. The speakers SPKL, SPKR are disposed between the ears of the person and the entrance. As a result, since the speakers SPKL, SPKR are disposed away from the entrance on a side of the seat SAT1 on which the passenger PS1 sits and in front of the ears of the passenger PS1, the content reproduced sound reproduced (output) from the speakers SPKL, SPKR can be hardly leaked from the entrance and can be easily heard by the passenger PS1.

In addition, the speakers SPKL, SPKR are the array speakers having the plurality of speaker elements 51 arranged in a row in the gravity direction which is the direction perpendicular to the floor surface FLR1 on which the seat SAT1 is provided. A center of the array speaker is located below the head of a person (for example, passenger PS1). As a result, each of the speakers SPKL, SPKR configured with the array speakers can reduce the difference in distance between the ears of the passenger PS1 and the center of each of the speakers SPKL, SPKR, and thus can easily form directivity, and the passenger PS1 can comfortably enjoy listening to the audio without wearing headphones or earphones.

The peripheral wall STW has an entrance (for example, the door DOR1 or the opening portion) through which a person (for example, the passenger PS1) enters a space (for example, the target room RM1) covered by the peripheral wall STW. The audio output surfaces PLL1, PLR1 of the speakers SPKL, SPKR are arranged to face a side opposite to the entrance. As a result, since the audio output surfaces PLL1, PLR1 where the content reproduced sound is reproduced (output) from the speakers SPKL, SPKR face the passenger PS1, the passenger PS1 can comfortably enjoy listening to the audio without wearing headphones or earphones.

The audio output surfaces PLL1, PLR1 of the speakers SPKL, SPKR are arranged toward the backrest BRS1 of the seat SAT1. As a result, since the audio output surfaces PLL1, PLR1 where the content reproduced sound is reproduced (output) from the speakers SPKL, SPKR face the passenger PS1, the passenger PS1 can comfortably enjoy listening to the audio without wearing headphones or earphones.

The peripheral wall STW has an entrance (for example, the door DOR1 or the opening portion) through which a person (for example, the passenger PS1) enters a space (for example, the target room RM1) covered by the peripheral wall STW. The speaker SPKL, the entrance, and the opening portion for entrance and exit of another person provided in a second peripheral wall (for example, the target room RM5) constituting the audio device provided for another person different from the person are not arranged on the straight line. As a result, even if the content reproduced sound output from the speaker SPKL disposed in the seat capable of providing the target room RM1 leaks to the aisle via the opening portion formed by cutting out a part of the peripheral wall STW of the corresponding seat, the content reproduced sound does not propagate via the opening portion of the seat used by another passenger, and thus it is possible to prevent the occurrence of the difference in content viewed by another passenger.

Although the embodiments are described above with reference to the drawings, it is needless to say that the present disclosure is not limited to such examples. It will be apparent that those skilled in the art can conceive of various modifications and alterations within the scope described in the claims, and it is understood that such modifications and alterations naturally belong to the technical scope of the present disclosure.

What is claimed is:

1. An acoustic control system comprising:
   a peripheral wall provided so as to surround a seat, and an upper portion of the peripheral wall being opened;
   a speaker provided inside the peripheral wall and capable of outputting a reproduced sound from a sound source;
   a microphone provided on the peripheral wall and configured to collect an environmental sound around the peripheral wall; and
   a processor,
   wherein the processor is configured to generate an input signal in which the reproduced sound at a position of the microphone from the speaker is removed from the environmental sound collected by the microphone, and is configured to suppress a level of the reproduced sound in a predetermined frequency band from the speaker based on the input signal and the reproduced sound at the position of the microphone.

2. The acoustic control system according to claim 1, wherein the microphone is disposed above the speaker.

3. The acoustic control system according to claim 1, wherein the processor is configured to cause a monitor to display an indicator indicating that a process of suppressing the level of the reproduced sound output from the speaker is being executed.

4. The acoustic control system according to claim 1, wherein the speaker is an array speaker having a plurality of speaker elements arranged in a row in a direction perpendicular to a floor surface on which the seat is provided.

5. The acoustic control system according to claim 1 wherein the processor includes a filter capable of suppressing the level of the reproduced sound from the speaker, and is configured to update the filter so that the reproduced sound at the position of the microphone becomes smaller than the input signal.

6. The acoustic control system according to claim 5, wherein in a case that there are a plurality of frequency bands in which the reproduced sound at the position of the microphone is larger than the input signal, the processor is configured to determine a suppression characteristic of the filter by combining amounts of suppression corresponding to the respective frequency bands with the plurality of frequency bands as predetermined frequency bands, and suppresses the level of the reproduced sound by the filter.

7. The acoustic control system according to claim 1 wherein the microphone includes a first microphone disposed on the peripheral wall on a left side as viewed from a front direction of the seat, and a second microphone disposed on the peripheral wall on a right side as viewed from the front direction of the seat, and
wherein the processor is configured to generate, as input signals, a first input signal obtained by removing the reproduced sound at a position of the first microphone from the speaker from the environmental sound and a second input signal obtained by removing the reproduced sound at a position of the second microphone from the speaker from the environmental sound, and is configured to suppress the level of the reproduced sound in the predetermined frequency band based on the input signals and the reproduced sound at the positions of the first microphone and the second microphone.

* * * * *